(12) United States Patent
Chan et al.

(10) Patent No.: US 11,750,156 B2
(45) Date of Patent: Sep. 5, 2023

(54) POWER AMPLIFIER

(71) Applicant: City University of Hong Kong, Kowloon (HK)

(72) Inventors: Wing Shing Chan, Kowloon (HK); Xin Yu Zhou, Kowloon (HK); Shi Chang Chen, Kowloon (HK); Wen Jie Feng, Kowloon (HK)

(73) Assignee: City University of Hong Kong, Kowloon (HK)

( * ) Notice: Subject to any disclaimer, the term of this patent is extended or adjusted under 35 U.S.C. 154(b) by 360 days.

(21) Appl. No.: 17/173,773

(22) Filed: Feb. 11, 2021

(65) Prior Publication Data

US 2022/0060156 A1     Feb. 24, 2022

Related U.S. Application Data

(60) Provisional application No. 63/069,228, filed on Aug. 24, 2020.

(51) Int. Cl.
*H03F 3/21* (2006.01)
*H03F 1/56* (2006.01)
*H03F 1/02* (2006.01)

(52) U.S. Cl.
CPC ........... *H03F 3/211* (2013.01); *H03F 1/0288* (2013.01); *H03F 1/56* (2013.01); *H03F 2200/222* (2013.01)

(58) Field of Classification Search
CPC ..................................................... H03F 3/211
See application file for complete search history.

(56) References Cited

U.S. PATENT DOCUMENTS

| 10,284,147 | B2 | 5/2019 | Wu et al. |
| 10,291,185 | B2 | 5/2019 | Lyalin et al. |
| 10,298,177 | B2 | 5/2019 | Cho et al. |
| 10,305,437 | B2 | 5/2019 | Ozard et al. |
| 10,320,335 | B1 | 6/2019 | Jang et al. |
| 10,355,647 | B2 | 7/2019 | Datta et al. |
| 10,483,918 | B2 | 11/2019 | Jin et al. |
| 10,491,165 | B2 | 11/2019 | Gaynor |
| 10,511,265 | B2 | 12/2019 | Ai et al. |
| 10,541,653 | B2 | 1/2020 | Zhu et al. |
| 11,463,055 | B2 * | 10/2022 | Li ............... H03F 3/2171 |
| 2018/0205348 | A1 * | 7/2018 | Barton ............ H03F 3/189 |
| 2019/0312552 | A1 * | 10/2019 | Chan ............. H03F 1/0288 |
| 2020/0373892 | A1 * | 11/2020 | Kim ............. H03F 3/2171 |

OTHER PUBLICATIONS

X.Y. Zhou, et al. Linearity Enhanced Harmonic-Modulated Impedance Inverter Doherty-Like Power Amplifier, IEEE 1549-8328 (2020).

* cited by examiner

*Primary Examiner* — Patricia T Nguyen
(74) *Attorney, Agent, or Firm* — RENNER KENNER GREIVE BOBAK TAYLOR & WEBER

(57) ABSTRACT

A power amplifier including: a main power amplification device having an output; an auxiliary power amplification device having an output; a load modulation circuit operably connected to the output of the main power amplification device and the output of the auxiliary power amplification device; and a post-matching circuit operably connected to load modulation circuit. The load modulation circuit is arranged to enable fundamental frequency load modulation and to enable modulated harmonic terminations of at least the second and third harmonic frequencies. The modulated harmonic terminations may include drain terminations.

24 Claims, 27 Drawing Sheets

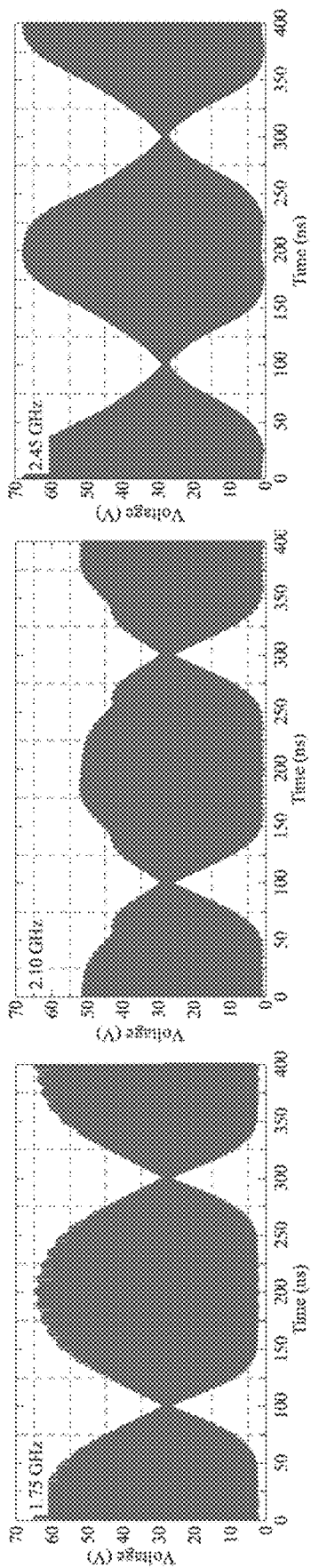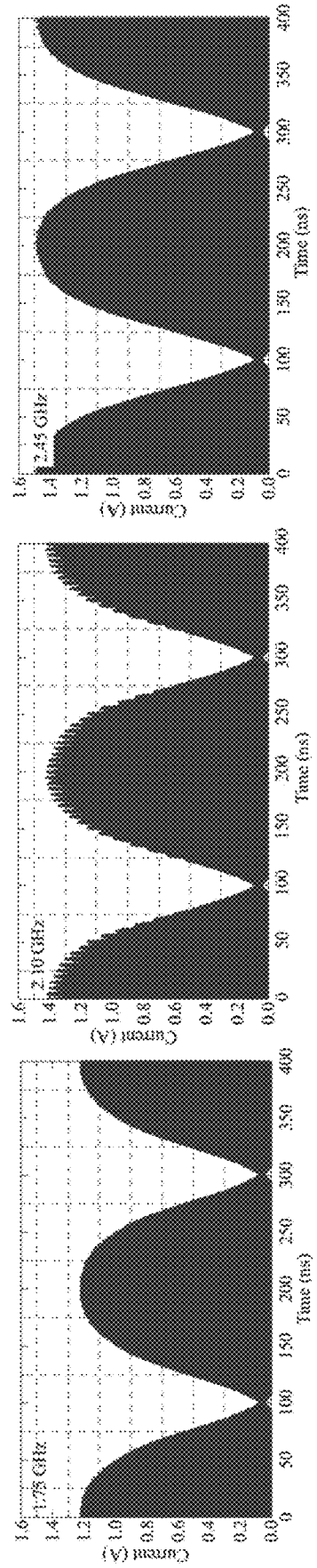
Figure 15A  Figure 15B  Figure 15C
Figure 15D  Figure 15E  Figure 15F $Z_C$ AT SECOND HARMONIC OVER THE ENTIRE OPERATING FREQUENCY RANGE

| Freq. | $2f_{low}$ (3.5 GHz) 3.5 GHz | $2f_0$ (4.2 GHz) 4.2 GHz | $2f_{high}$ (4.9 GHz) 4.9 GHz |
|---|---|---|---|
| $Z_C$ when i/p=20 dBm | 4.5 - j61.6 | 9.03 - j5.7 | 1.7 - j32.1 |
| $Z_C$ when i/p=25 dBm | -13.3 - j38.9 | 5.85 - j3.3 | -3.327 - j32.7 |
| $Z_C$ when i/p=30 dBm | -59.9 - j20 | -4.84 + j6.2 | -3.6 - j36.3 |

Figure 24

$Z_P$ AT SECOND HARMONIC OVER THE ENTIRE OPERATING FREQUENCY RANGE

| Freq. | $2f_{low}$ 3.5 | $2f_0$ 4.2 GHz | $2f_{high}$ 4.9 GHz |
|---|---|---|---|
| $Z_P$ when i/p=25 dBm | 5.0 - j49.7 | 55.1 + j5.0 | 0.7 - j27.3 |
| $Z_P$ when i/p=30 dBm | 0.9 - j47.8 | 19.6 + j16.4 | 10.5 - j32.3 |

Figure 25

IMD3 at low power level (24 dBm)

| Freq. (GHz) | 1.75 | 1.85 | 1.95 | 2.05 | 2.15 | 2.25 | 2.35 | 2.45 |
|---|---|---|---|---|---|---|---|---|
| IMD3_Lower | -30.2 | -30.7 | -30.33 | -30.5 | -30.7 | -30.4 | -32 | -36 |
| IMD3_Upper | -30.5 | -30.1 | -30.3 | -30.43 | -30.2 | -30.4 | -33.37 | -35.5 |

Figure 26

PAEs when the IMD3 first reached -30 dBc

| Freq. (GHz) | 1.75 | 1.85 | 1.95 | 2.05 | 2.15 | 2.25 | 2.35 | 2.45 |
|---|---|---|---|---|---|---|---|---|
| IMD3_Lower | 53.5 | 56 | 59 | 57 | 59 | 59 | 68.5 | 56 |
| IMD3_Upper | 53.5 | 53 | 56.5 | 54 | 59 | 53.6 | 65.9 | 55.5 |

Figure 27

POWER AMPLIFIER

TECHNICAL FIELD

The invention relates to a power amplifier, and particularly, although not exclusively, to a Doherty-like power amplifier (e.g., Doherty power amplifier).

BACKGROUND

High efficiency power amplifiers are a key part of modern advanced transmitter architectures. In recent years, various techniques have been developed for single-ended power amplifiers, such as Class-F, Class-E and Class-J, all of which have achieved efficiency improvements at saturation. However, in modern and future wireless communication systems, the modulated signals have high peak to average power ratios (PAPRs). Therefore, the high efficiency requirement is shifted from operation at saturation to the output back-off (OBO) region. Therefore, power amplifiers with high efficiency and high linearity in the output back-off region is needed. On the other hand, with the multi-input multi-output techniques being widely used in modern and future wireless communication systems, power amplifiers are also required to have wideband operation.

To achieve high efficiency and high linearity in the output back-off region, various Doherty power amplifier (DPA) designs have been proposed.

N. De Carvalho and J. Pedro, "*Large- and small-signal IMD behavior of microwave power amplifiers,*" *IEEE Trans. Microw. Theory Techn.*, vol. 47, no. 12, pp. 2364-2374, 1999 has provided a comprehensive analysis of intermodulation distortion (IMD) behavior in RF power amplifiers. When such analysis was applied to conventional Doherty power amplifier, it was found that in-band non-linearity, e.g., third-order intermodulation distortion (IMD3), may deteriorate significantly due to unwanted clipping of the current.

SUMMARY OF THE INVENTION

In a first aspect there is provided a power amplifier comprising: a main power amplification device having an output; an auxiliary power amplification device having an output; a load modulation circuit operably connected to the output of the main power amplification device and the output of the auxiliary power amplification device; and a post-matching circuit operably connected to load modulation circuit. The load modulation circuit is arranged to enable fundamental frequency load modulation and to enable modulated harmonic terminations of at least the second and third harmonic frequencies. The modulated harmonic terminations may include drain terminations.

In one embodiment of the first aspect, the load modulation circuit comprises: a first harmonic-modulated impedance inverter operably connected with the output of the main power amplification device; a second harmonic-modulated impedance inverter operably connected with the output of the auxiliary power amplification device; and a phase compensation circuit operably connected between the first and second harmonic-modulated impedance inverters. The first harmonic-modulated impedance inverter may be directly connected with the output of the main power amplification device. The second harmonic-modulated impedance inverter may be directly connected with the output of the auxiliary power amplification device. The phase compensation circuit may be directly connected between the first and second harmonic-modulated impedance inverters.

In one embodiment of the first aspect, a combining node is defined between the phase compensation circuit and the first harmonic-modulated impedance inverter, and the post-matching circuit is connected at the combining node.

In one embodiment of the first aspect, each of the first and second harmonic-modulated impedance inverters include: a first transmission line; a second transmission line; a coupled line arranged to provide an electric coupling and operably connected between the first and second transmission lines; and a grounded capacitor arrangement operably connected with the coupled line. The first transmission line may be a microstrip line. The second transmission line may be a microstrip line. The coupled line may be an end-connected coupled line. The grounded capacitor arrangement may include one or more capacitive elements (e.g., capacitors).

In one embodiment of the first aspect, the first and second transmission lines are parallel or collinear.

In one embodiment of the first aspect, the coupled line includes first and second coupled portions that provides the electric coupling. The first and second coupled portions extend substantially perpendicularly to the first and second transmission lines.

In one embodiment of the first aspect, the first and second transmission lines and the coupled line are connected continuously.

In one embodiment of the first aspect, the first and second harmonic-modulated impedance inverters include the same electrical length.

In one embodiment of the first aspect, the phase compensation circuit comprises a transmission line. The transmission line may be a microstrip line, e.g., a quarter wavelength microstrip line.

In one embodiment of the first aspect, the post-matching circuit is operable to provide an impedance arranged to reduce or substantially prevent harmonic current leakage. The post-matching circuit may be a high-order low pass post-matching circuit.

In one embodiment of the first aspect, the main power amplification device comprises a first active device and the auxiliary power amplification device comprises a second active device in phase quadrature with the first active device. The first and/or second active device may include a transistor (such as a FET, a HEMT, a GaN transistor, or the like).

In one embodiment of the first aspect, the main power amplification device is a carrier device, e.g., an amplifier device arranged for Class AB operation (operate as a Class AB amplifier). In one embodiment of the first aspect, the auxiliary power amplification device is a peaking device, e.g., an amplifier device arranged for Class C operation (operate as a Class C amplifier).

In a second aspect, there is provided an electrical device or system comprising one or more of the power amplifier of the first aspect. The electrical device and/or system may include base station (e.g., for cellular communication, such as 4G, 5G, 6G, or higher), laptop computer, desktop computer, tablet computer, smart phone, smart watch, IoT device, etc.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

BRIEF DESCRIPTION OF THE DRAWINGS

Embodiments of the invention will now be described, by way of example, with reference to the accompanying drawings in which:

FIG. 15A is a graph illustrating carrier voltage waveform of 1.75 GHz when the IMD3 of the Doherty-like power amplifier first reaches −30 dBc within the operating frequency range;

FIG. 15B is a graph illustrating carrier voltage waveform of 2.10 GHz when the IMD3 of the Doherty-like power amplifier first reaches −30 dBc within the operating frequency range;

FIG. 15C is a graph illustrating carrier voltage waveform of 2.45 GHz when the IMD3 of the Doherty-like power amplifier first reaches −30 dBc within the operating frequency range;

FIG. 15D is a graph illustrating carrier current waveform of 1.75 GHz when the IMD3 of the Doherty-like power amplifier first reaches −30 dBc within the operating frequency range;

FIG. 15E is a graph illustrating carrier current waveform of 2.10 GHz when the IMD3 of the Doherty-like power amplifier first reaches −30 dBc within the operating frequency range;

FIG. 15F is a graph illustrating carrier current waveform of 2.45 GHz when the IMD3 of the Doherty-like power amplifier first reaches −30 dBc within the operating frequency range;

FIG. 24 is a table illustrating the simulated values of $Z_c$ at second harmonic over the operating frequency range;

FIG. 25 is a table illustrating the simulated values of $Z_p$ at second harmonic over the operating frequency range;

FIG. 26 is a table illustrating the measured upper and lower IMD3 of the Doherty-like power amplifier of FIG. 17 at low power level (24 dBm); and FIG. 27 is a table illustrating the measured power added efficiencies of the Doherty-like power amplifier of FIG. 17 when the IMD3 first reached −30 dBc.

DETAILED DESCRIPTION

The inventors of the invention has devised, through research, experiments, and/or trials, that while a Doherty power amplifier can be considered as a $3^{rd}$-order intermodulation distortions (IMD3) improved power amplifier at the back-off point, its IMD3 is mainly limited by the unwanted clipping current of the active device at saturation. When the drain voltage of active device reaches the knee voltage ($V_{knee}$), the current waveform gets clipped and hence a strong non-linearity is generated, leading to a rapid deterioration of IMD3. The clipping contours may be used to design the loads for a high-frequency power device in order to avoid clipping of the drain current. To prevent deterioration of the output power, the non-clipping region for the second harmonic termination can be extended through proper tuning of the third harmonic termination instead of the fundamental load. For the strictest termination conditions, the fundamental and third harmonic terminations can be presented as:

$$Z@f_0 = Z_{opt}, Z@3f_0 = 0 \quad (1)$$

Under these termination conditions, the non-clipping region requires that the second harmonic termination be located outside of the Smith chart, i.e., negative resistance. When the third harmonic termination moves along the edge of Smith chart (small pure reactance impedance), the second harmonic non-clipping region can be generated.

Locating the third harmonic drain termination near the "short-circuit" does not result in a linear power amplifier design unless a negative second harmonic drain resistance can be obtained. However, a negative resistance cannot be realized in a single-ended power amplifier in practice. Therefore, to improve the linearity of Doherty-like power amplifiers, such as Doherty power amplifiers, the Doherty-like power amplifier in one embodiment of the invention includes impedance inverters that can modulate not only the fundamental termination, but also the second and third harmonic terminations in order to achieve the negative and short circuited termination conditions, for improved linearity.

Figure 1:
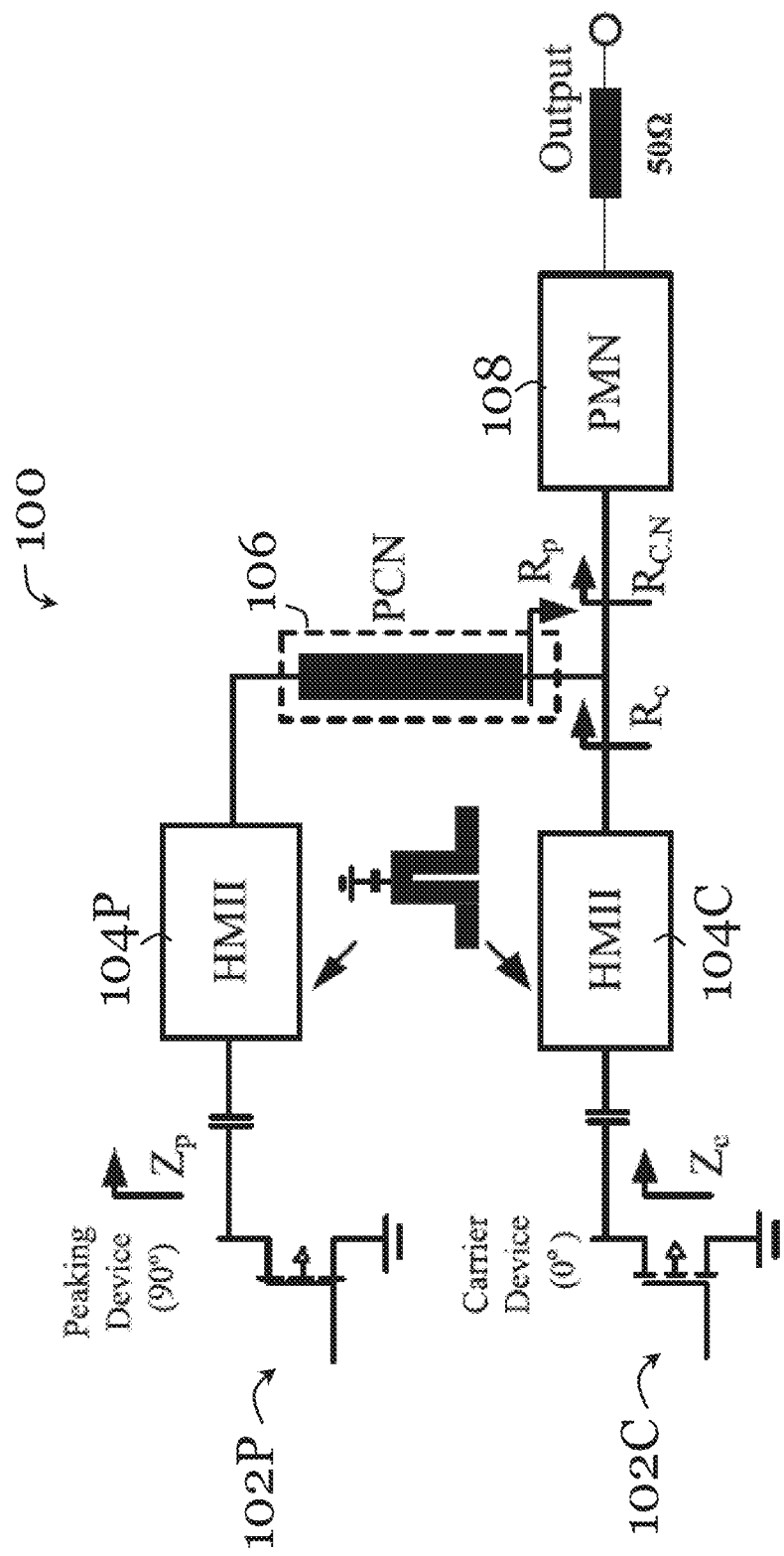
FIG. 1 is a schematic circuit diagram of a Doherty-like power amplifier in one embodiment of the invention.

FIG. 1 illustrates a Doherty-like power amplifier 100 in one embodiment of the invention. As shown in FIG. 1, the Doherty-like power amplifier 100 includes peaking and carrier devices 102P, 102C, formed by transistors, in phase quadrature.

Figure 5:
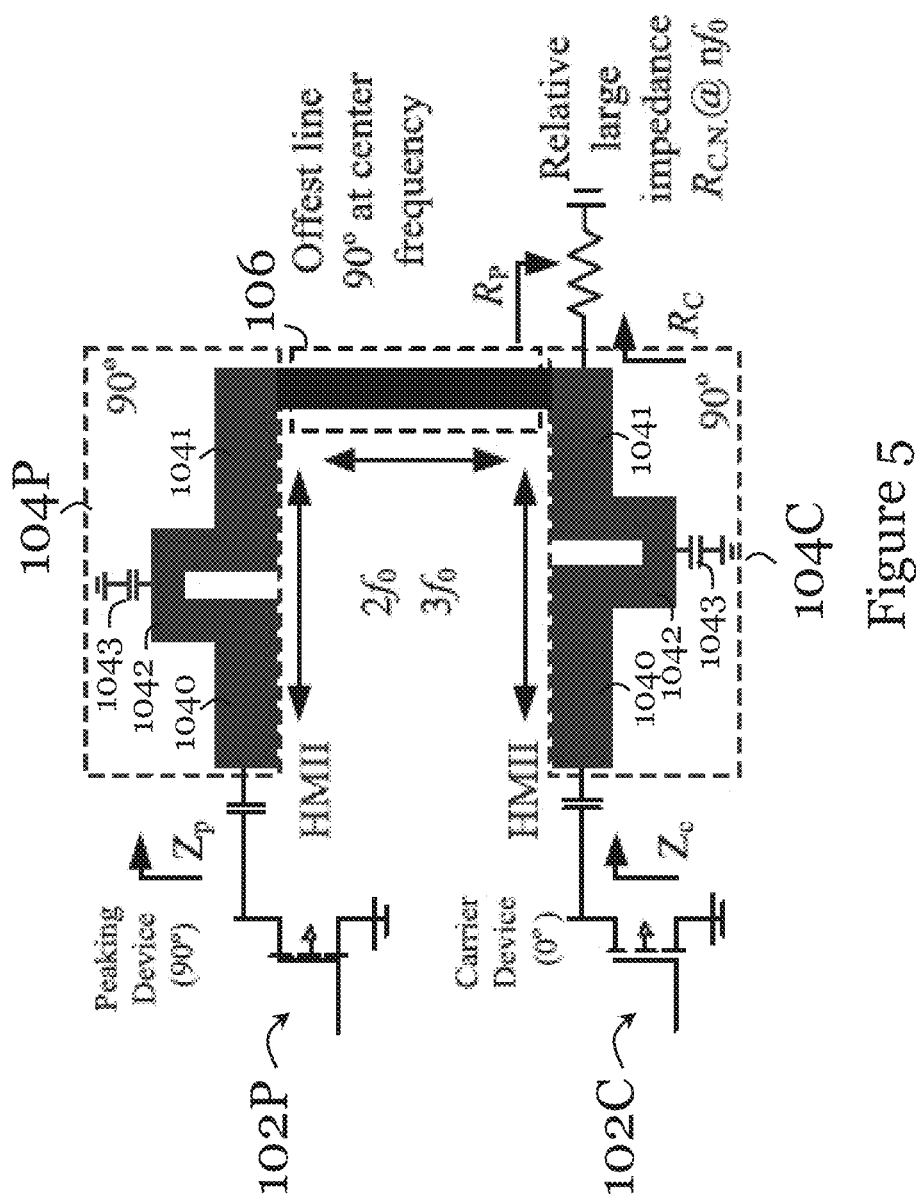
FIG. 5 is a schematic circuit diagram of a Doherty-like power amplifier of FIG. 1, illustrating the operation at second and third harmonics.

The amplifier 100 also includes two harmonic modulated impedance inverters 104P, 104C, one connected with a respective one of the output of the peaking and carrier devices 102P, 102C. A capacitive arrangement (e.g., a capacitor) is arranged between the harmonic modulated impedance inverter 104P and the peaking amplifier 102P. Another capacitive arrangement (e.g., a capacitor) is arranged between the harmonic modulated impedance inverter 104C and the carrier amplifier 102C. A quarter-wavelength phase compensation network 106 is connected between the harmonic modulated impedance inverters 104P, 104C. The phase compensation network 106 in this example is a microstrip line. A post-matching network 108 is connected between the output and the phase compensation network 106, and between the output and the harmonic modulated impedance inverter 104C. The post-matching network 108 in this example is a high-order low-pass post-matching network. The harmonic modulated impedance inverters 104P, 104C and the phase compensation network 106 may form (optionally with other components such as the post-matching network 108) a load modulation network. As will be explained in greater detail below, the load modulation network is arranged to enable fundamental frequency load modulation and to enable modulated harmonic terminations (e.g., drain terminations) of at least the second and third harmonic frequencies. Referring to FIGS. 1 and 5, each of the harmonic modulated impedance inverter 104P, 104C includes two generally collinear microstrip lines 1040, 1041, an end-connected coupled line 1042 connected with both microstrip lines 1040, 1041, and a grounded capacitor 1043 connected to the end-connected coupled line 1042 at a side opposite the microstrip lines 1040, 1041. The harmonic modulated impedance inverters 104P, 104C have substantially the same electrical length.

In FIG. 1, $R_c$ and $R_p$ are defined as the load resistance of the carrier and peaking branch respectively, and $Z_c$ and $Z_p$ are defined as the drain impedance of carrier and peaking devices 102C, 102P respectively. $R_{C.N.}$ is the impedance at the combining node (C.N.), i.e., the node at the junction of the harmonic modulated impedance inverters 104C, the phase compensation network 106, and the post-matching network 108.

When the output power of Doherty-like power amplifier 100 is below the back-off point, $R_c$ and $R_p$ can be expressed as $$R_c@f_0 = R_L, \text{ Inverse Direction } R_P@f_0 = \infty \text{ Back-off} \quad (2)$$

where $Z_{opt,z}$ and $Z_{opt,p}$ are the optimal impedance of the carrier and peaking devices 102C, 102P, respectively. With an increase in output power, the peaking device 102P then turns on and the Doherty-like power amplifier 100 enters into the Doherty region. $R_c$ and $R_p$ at saturation can then be obtained as $$R_c@f_0 = 2R_L, R_p@f_0 = 2R_L \text{ Saturation} \quad (3)$$

In order to satisfy the operating conditions of Equations (2) and (3), the fundamental load modulation ability of the harmonic modulated impedance inverter 104P, 104C has to be formulated.

Figure 2:
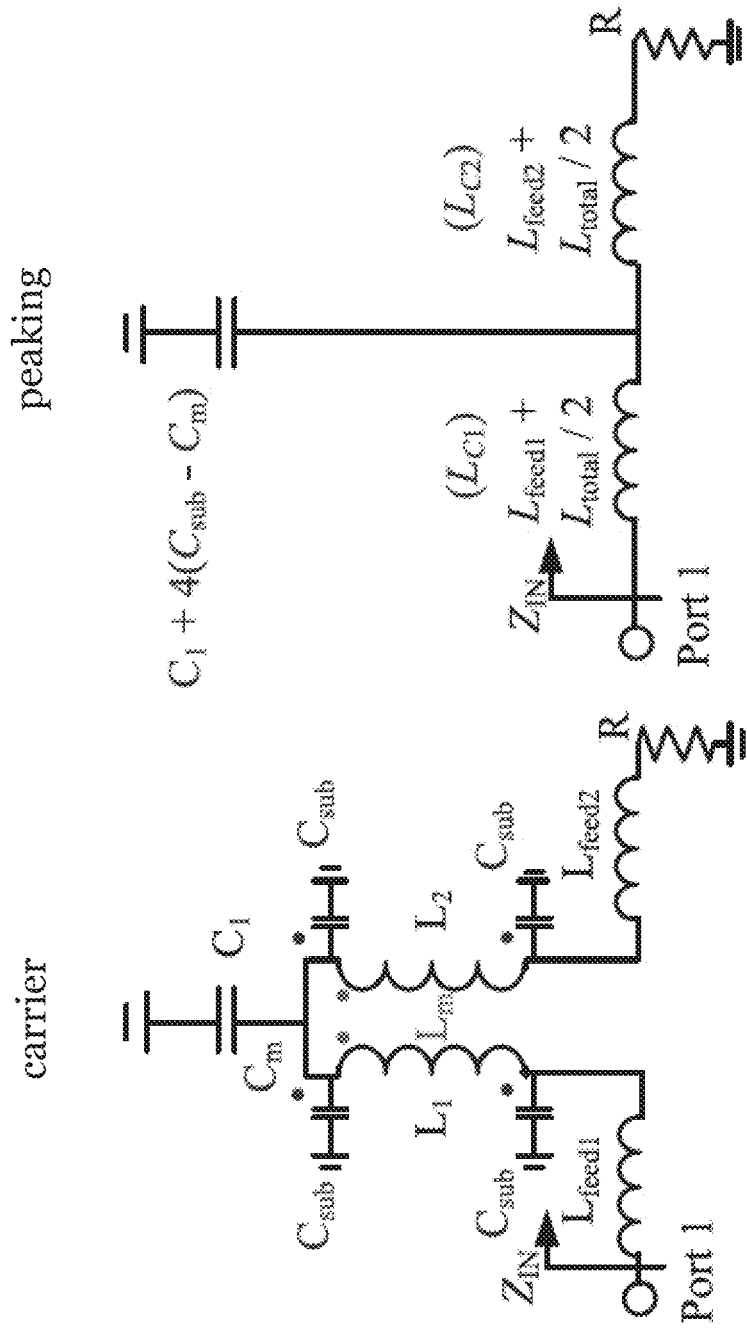
FIG. 2 is a circuit diagram showing equivalent circuits of the harmonic modulated impedance inverter for the carrier and the peaking devices in the Doherty-like power amplifier of FIG. 1.

FIG. 2 shows the equivalent circuit of a harmonic modulated impedance inverter topology for the carrier and peaking amplifiers 102C, 102P. As shown in FIG. 2, the equivalent circuit of the harmonic modulated impedance inverter is composed of two feeding inductors ($L_{feed1}$ and $L_{feed2}$), two coupling inductors ($L_1$ and $L_2$), four substrate capacitors ($C_{sub}$) and a paralleled grounded capacitor ($C_1$). The inductor $L_1$ and $L_2$ are mutual cumulatively coupled in series and the total inductance of coupled inductors can be calculated as $$L_{total} = L_1 + L_2 + 2L_m, L_m \le k_m\sqrt{L_1 L_2} \quad (4)$$

Each of the two capacitors $C_{sub}$ are mutually coupled and their coupled capacitance can be calculated as $$C_m = k_e \times \sqrt{C_{sub} \times C_{sub}} \quad (5)$$

where $k_m$ and $k_e$ are the magnetic and electric coupling coefficients. It should be noted that compared with a conventional T-type impedance inverter, the harmonic modulated impedance inverter in this embodiment has a wider operating bandwidth due to the additional electric coupling ($C_m$), which is generated by $C_{sub}$ from the coupled line.

In this example, each inductor has a value of half $L_{total}$. The inductor of $L_{feed1}+L_{total}/2$ and $L_{feed2}+L_{total}/2$ can be considered as two independent inductors ($L_{C1}$ and $L_{C2}$). The capacitor of $C_1+4(C_{sub}-C_m)$ may be simplified to $C_1$ because $4(C_{sub}-C_m)$ is generated by the substrate capacitance of the coupled lines, which cannot be changed in the actual design and would unnecessarily complicate calculation. Hence, without loss of generality, its value is ignored in the calculation of the input impedance of the harmonic modulated impedance inverter 104P, 104C.

Figure 3:
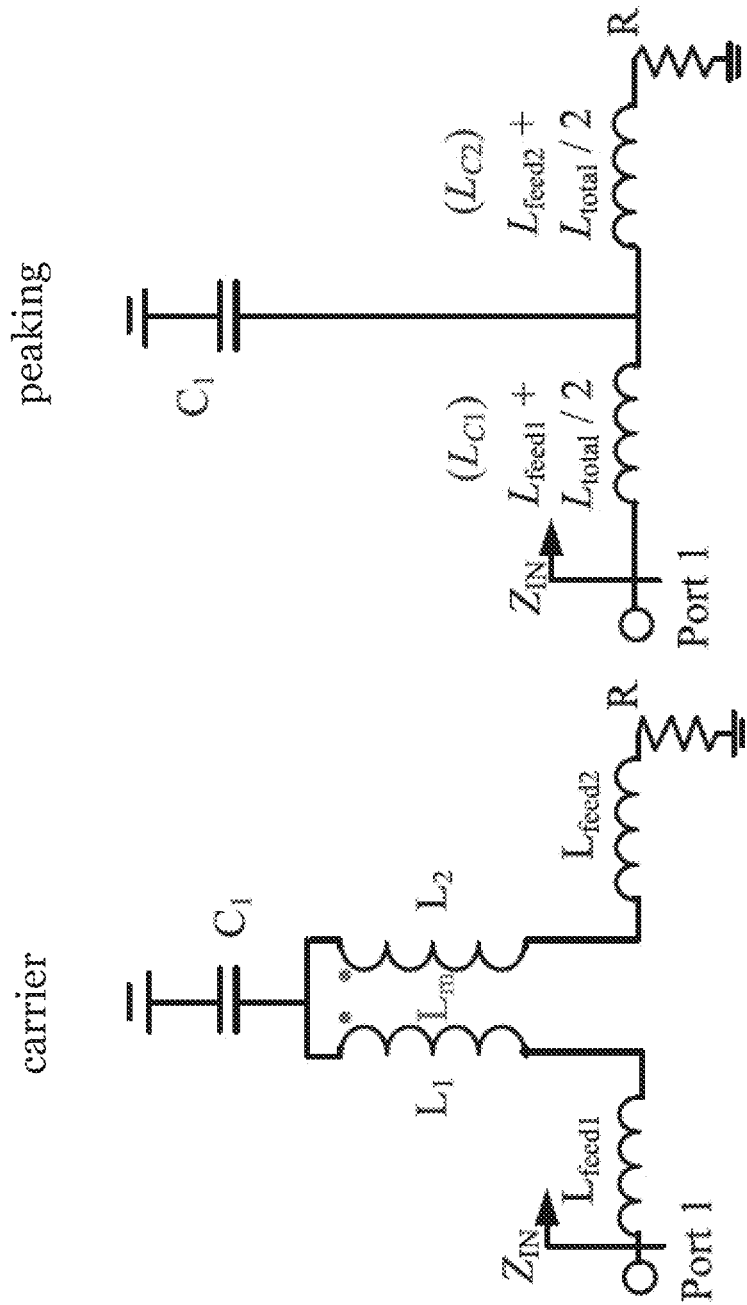
FIG. 3 is a circuit diagram showing simplified equivalent circuits of the equivalent circuits of FIG. 2.

FIG. 3 shows a simplified version of the equivalent circuit of FIG. 2.

Consequently, the equivalent circuit of the harmonic modulated impedance inverter 104P, 104C is a "T-type" circuit model and its input impedance can be calculated as $$Z_{IN} = j\omega L_{C1} + 1 \Big/ \left( j\omega C_1 + \frac{1}{R + j\omega L_{C2}} \right), \quad (6)$$

$$R = \begin{cases} R_L, & \text{Back-off} \\ 2R_L, & \text{Saturation} \end{cases}$$

For GaN transistors (which forms at least part of the carrier and peaking amplifiers 102C, 102P) operating in the Doherty region, the real part of $Z_{opt,c}$ at output back-off and saturation is almost unchanged while the imaginary part moves towards the real axis with increase in output power. In this example, $\omega_o$ and $R_L$ are set to 1 (rad/s and Ω). The real part condition of $Z_{IN}@f_o$ can then be expressed as $$\frac{\dfrac{1}{1+L_{C2}^2}}{\dfrac{1}{\left(1+L_{C2}^2\right)^2} + \left(C_1 - \dfrac{L_{C2}}{1+L_{C2}^2}\right)^2}(OBO.) = \quad (7)$$

$$\frac{\dfrac{2}{4+L_{C2}^2}}{\dfrac{4}{\left(4+L_{C2}^2\right)^2} + \left(C_1 - \dfrac{L_{C2}}{4+L_{C2}^2}\right)^2}(Sat.)$$

Figure 4:
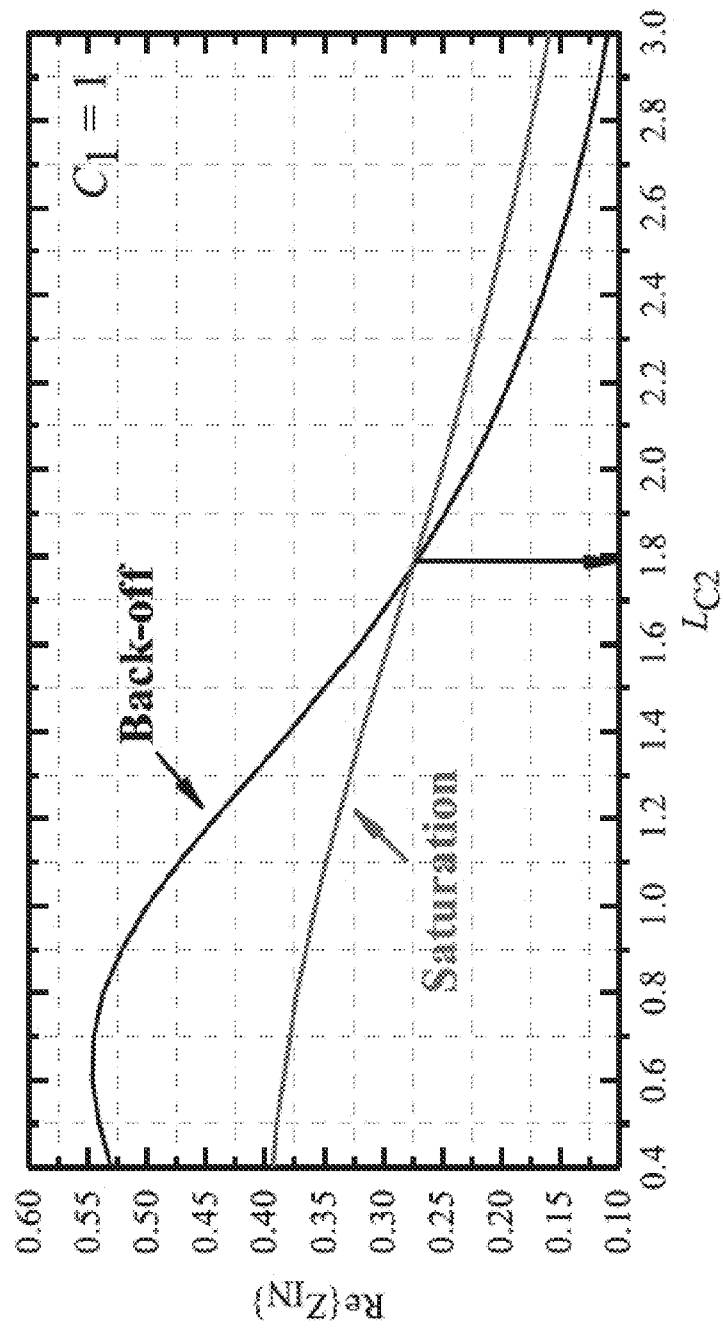
FIG. 4 is a graph showing the variation of real part condition of $Z_{in}$ (Re $\{Z_{IN}\}$) at output back-off and at saturation against the inductance $L_{c2}$.

The mathematical relationship between $C_1$ and $L_{C2}$ is complicated. To determine this relationship, set $C_1$ to 1 (F) and sweep the value of $L_{C2}$ from 0.5 to 2 (H) to calculate Re $\{Z_{IN}\}$ at output back-off and saturation. The results are shown in the graph of FIG. 4.

The Re $\{Z_{IN}\}$ at output back-off and saturation are the same when $L_{C2}=1.8$. Correspondingly, the ratio between $L_{C2}$ and $C_1$ can be calculated as $$L_{C2}/C_1=1.8 \quad (8)$$

Then, based on the relationship obtained from Equation (8), $C_1$ could be selected, e.g., as $C_1=1$ (F), to satisfy the required variation of the imaginary part of carrier $Z_{IN}$.

$$\left| jL_{C1} + \frac{C_1 - \dfrac{L_{C2}}{1+L_{C2}^2}}{\dfrac{1}{\left(1+L_{C2}^2\right)^2} + \left(C_1 - \dfrac{L_{C2}}{1+L_{C2}^2}\right)^2} \right|(OBO.) > \quad (9)$$

$$\left| jL_{C1} + \frac{C_1 - \dfrac{L_{C2}}{4+L_{C2}^2}}{\dfrac{4}{\left(4+L_{C2}^2\right)^2} + \left(C_1 - \dfrac{L_{C2}}{4+L_{C2}^2}\right)^2} \right|(Sat.)$$

Unlike the conventional impedance inverter, which only transforms the impedance at the fundamental frequency, the "T-type" impedance inverter network in this embodiment may also achieve termination interaction at harmonic frequencies. In this embodiment, the function of the harmonic modulated impedance inverter 104P, 104C is to allow second and third harmonic components to pass through substantially without loss. In other words, "all pass" characteristic up to the third harmonic is required for the harmonic modulated impedance inverter 104P, 104C.

Meanwhile, the post-matching network 108 in this embodiment performs not only fundamental frequency matching but also harmonic impedance manipulation $R_{C.N.}@nf_o$ (n=2, 3, . . . ) to the common node of the Doherty-like power amplifier 100. As illustrated in FIG. 5, $R_{C.N}@2f_o$ and $R_{C.N}@3f_o$ should have a relatively large impedance to prevent harmonic current leakage. Since the harmonic modulated impedance inverters 104P, 104C have substantially the same electrical length, only the offset line of the phase compensation network 106 needs to be considered for the harmonic phase shift.

According to the theoretical analysis in M. D. Roberg, "*Analysis & design of non-linear amplifiers for efficient microwave transmitters,*" Ph.D. dissertation, Dept. Elect. Eng., Colorado Univ., Denver, Colo., USA, 2012., the load impedance of one current source can be modulated by the injected current from the other current source. Hence, the overall $R_{C'}@2f_o$ in the Doherty-like power amplifier 100 can be calculated as $$R_{C'}@2f_0 = R_C \frac{R_P + \sqrt{R_C R_P \rho}}{R_C - \sqrt{R_C R_P \rho}}, \quad \rho = \frac{i_{2P}}{i_{2C}} \quad (10)$$

where $R_C$ and $R_P$ represent the load impedances of the carrier and peaking amplifiers at second harmonics (theoretically should be $2R_{C.N}@2f_o$). $i_{2C}$ and $i_{2P}$ are the $2^{nd}$ harmonic current of the carrier and peaking devices 102C, 102P, respectively.

For a generalized analysis, impedance $R_c$ can be normalized such that Equation (10) can be expressed as $$r_{C'}@2f_0 = \frac{r_P + \sqrt{r_P \rho}}{1 - \sqrt{r_P \rho}} \quad (11)$$

At the combining node, $R_C=R_P$. Therefore, $r_p=1$, thus $r_{C'}@2f_o$ can be expressed as $$r_{C'}@2f_0 = \frac{1+\rho}{1-\rho} \quad (12)$$

Accordingly, the normalized $Z_c@2f_o$ can also be modulated by the injected second harmonic current. Using a similar method of calculation, $r_p'$, can also be obtained.

Figure 6:
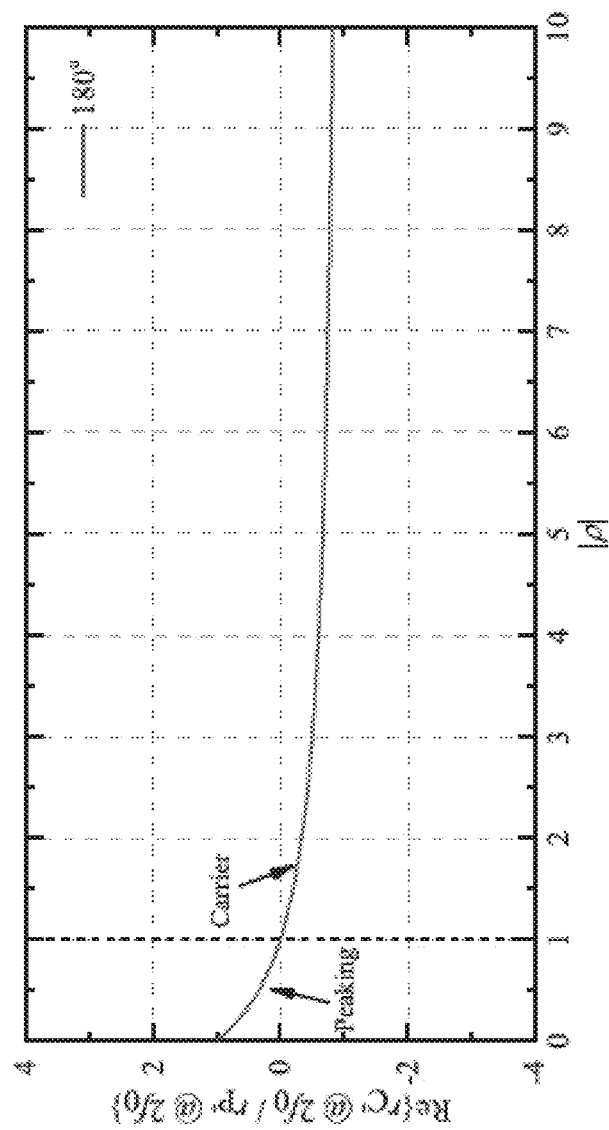
FIG. 6 is a graph showing the real part of the normalized impedance $r_c'$ at second harmonics and the normalized impedance $r_p'$ at second harmonics when $\angle\rho=180°$ for different magnitude of current ratio $\rho$.

FIG. 6 shows the real part of $r_c'@2f_o$ and $r_p'@2f_o$ when $\angle\rho=180°$ for different $\rho$. It should be noted that there is no imaginary part for $r_c'@2f_o$ and $r_p'@2f_o$ when $\angle\rho=180°$.

Before demonstrating the operating principle at the second harmonic of harmonic modulated impedance inverter 104P, 104C, it should be appreciated that:

1. There is a 180 phase difference between the second harmonic current of the peaking and carrier devices 102P, 102C, e.g., opposite sign of the harmonic current 2. The peaking device 102P has the higher second harmonic current compared to the carrier device 102C On this basis, the sign of injected second harmonic current is opposite to the one produced by the device 102P, 102C itself.

For the carrier device 102C, |ρ| is larger than 1 and the condition in FIG. 6 is then 180°. Hence, the negative impedance of $Z_c@2f_o$ can be obtained, which satisfies the non-clipping condition. In terms of the optimal negative $Z_c@2f_o$, the real part of $Z_c@2f_o$ is reduced to a negative value with increase in injected harmonic current from the peaking device 102P. However, the harmonic current amplitude difference between the peaking and carrier devices 102P, 102C is limited, which prevents further decrease in the real part of $Z_c@2f_o$. Hence, the location of optimal $Z_c@2f_o$ should graze the left outer edge of Smith chart.

For the peaking device 102P, |ρ| is smaller than 1, which results in positive $Z_p@2f_o$ and it is still located within the Smith chart. For non-clipping current, $Z_p@2f_o$ should be located within the non-clipping region, which is normally generated by a "pure reactance" of $Z_p@3f_o$.

Theoretically, third harmonic currents of the peaking and carrier devices 102P, 102C also mutually flow through the load modulation network. However, in practice, the insertion loss of the entire load modulation network is large at the third harmonic frequency. Therefore, the capability of harmonic current modulation is very weak, which can subsequently be ignored. Under this condition, the carrier and peaking devices 102C, 102P at the third harmonic drain termination behave more like two independent power amplifiers with relatively large harmonic loading impedance. The third harmonic drain terminations at output back-off and saturation can then be calculated by using Equation (6) and setting ω as 3.

Due to the relatively large $R_{C.N}@3f_o$, the real part and imaginary part of third harmonic drain termination of carrier and peaking device 102C, 102P can be simplified as $$\text{Re}\{Z_{IN}@3f_0\} = \frac{1}{9C_1^2 R_{C.N.}@3f_0}, \text{Im}\{Z_{IN}@3f_0\} = 3L_{C1} - \frac{1}{3C_1} \quad (13)$$

$$\text{Re}\{Z_{IN}@3f_0\} = \frac{1}{18C_1^2 R_{C.N.}@3f_0}, \text{Im}\{Z_{IN}@3f_0\} = 3L_{C1} - \frac{1}{3C_1} \quad (14)$$

For the real part, its value is always small at back-off and reduces further at saturation, which results in the real part of $Z_{C/P}@3f_o$ being nearly equal to "zero". The imaginary part always has a value of $3L_{C1}-\frac{1}{3}C_1$ at back-off and saturation. Hence, the "pure reactance" of $Z_{C/P}@3f_o$ can be obtained by the proper tuning of $L_{C1}$ and $C_1$, which generates an additional non-clipping region for $Z_{C/P}@2f_o$, which can cover most impedances near the "short circuit" point of the Smith chart.

The Doherty-like power amplifier 100 in this embodiment can operate over a relatively wide bandwidth. The reasons are as follows. First, the impedance inverter 104P, 104C has a wider bandwidth of impedance transformation due to the additional electric coupling ($C_m$) generated by the coupled line. Second, the bandwidth of the second harmonic injection mainly relies on the phase dispersion of the offset line of the phase compensation network 106. In one embodiment, the broadband configuration of second harmonic injection technique can be achieved by using 90° transmission line. Third, for the third harmonic frequency, as mentioned previously, the peaking and carrier devices 102P, 102C operate independently. Hence, the phase dispersion of the load modulation network does not influence the third harmonic operating bandwidth.

In this embodiment, the input matching networks of the Doherty-like power amplifier 100 are designed to match the optimal gate impedance of the transistor of the peaking and carrier devices 102P, 102C. The stabilization network is comprised of a pair of a paralleled resistor and capacitor (RC). This realizes unconditional stability for each of the peaking and carrier devices 102P, 102C, as well as ensuring gain flatness under small signal excitation. For the output side, the design method of the Doherty-like power amplifier 100 will now be described for the carrier and peaking harmonic modulated impedance inverter 104C, 104P and post-matching network 108.

Figure 7:
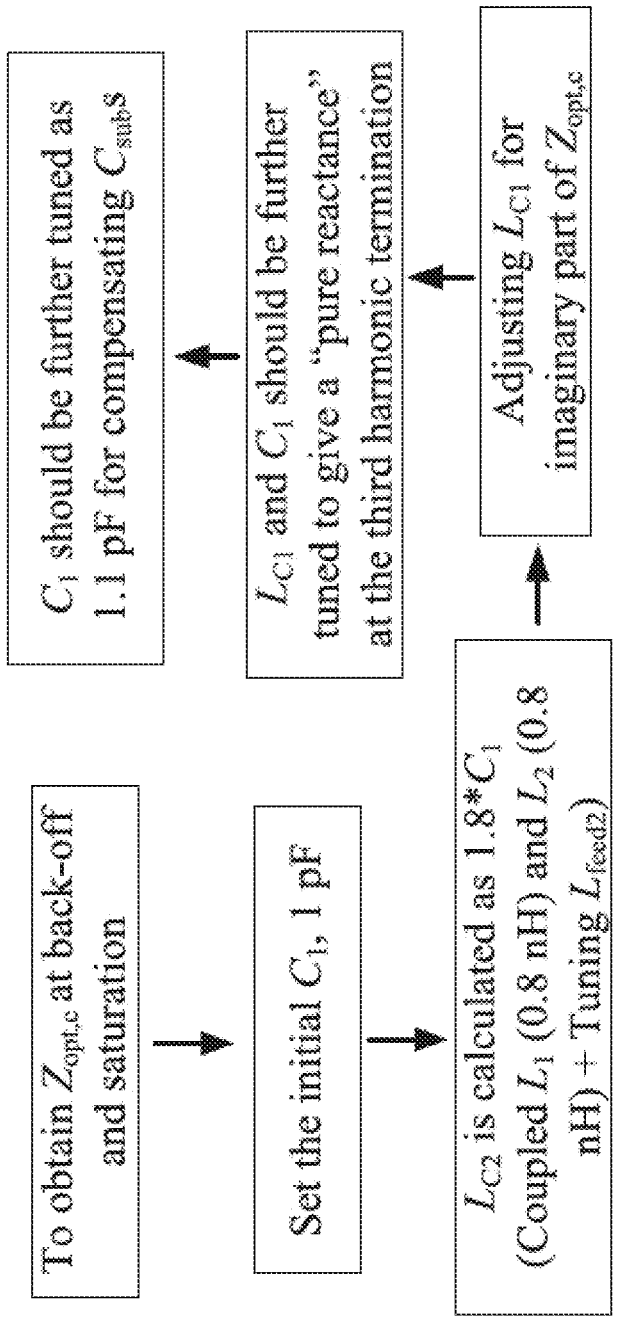
FIG. 7 is a flow diagram illustrating a method for designing a harmonic modulated impedance inverter for the carrier device in one embodiment of the invention.

The design of the carrier harmonic-modulated impedance inverter 104C is now presented. Firstly, $Z_{opt,c}$ at back-off and saturation is obtained using Keysight ADS load-pull simulation software. In particular, for GaN transistors in the Doherty-like power amplifier 100, the imaginary part of $Z_{opt,c}$ moves towards the real axis from back-off to saturation. $Z_{opt,c}$ at saturation is therefore required to have a small imaginary part. Hence, the $Z_{opt,c}$ selection strategy is to find an impedance that achieves high efficiency at saturation. Secondly, the initial value of $C_1$ should be set. Then, $L_{C2}$ can be calculated based on Equation (8). $L_{C2}$ is composed of a pair of coupled inductors and the output feeding line ($L_{feed2}$) of the harmonic modulated impedance inverter 104C. For the coupled inductors, there are multiple solutions that satisfy the requirement. $L_1$, $L_2$, k are selected as 0.8 nH, 0.8 nH and 0.44 for the Doherty-like power amplifier, respectively. While for the $L_{feed2}$, it can be used for further tuning the value of $L_{C2}$. In practice, the inevitable transistor parasitic would introduce an imaginary part to the optimal drain impedance. This can be readily adjusted by changing the value of $L_{C1}$. Then, according to Equations (13) and (14), the relationship between $L_{C1}$ and $C_1$ should be considered and further tuned to give a "pure reactance" at the third harmonic. It should be noted that the $C_1$ should be further tuned to compensate for the influence of substrate capacitance ($C_{sub}$), which is generated by the coupled line. Finally, after several iterations, the carrier harmonic modulated impedance inverter 104C is obtained. The design flow chart of the carrier harmonic modulated impedance inverter 104C is shown in FIG. 7.

The design of the peaking harmonic-modulated impedance inverter 104P is now presented. Similar to the carrier amplifier design, $Z_{opt,p}$ should be obtained by using the load-pull simulator. Then, the design of the peaking harmonic modulated impedance inverter 104P needs to realize an impedance transformation from $2R_L$ to $Z_{opt,p}$ at saturation. A proper value of $L_{C2}$ should be selected to enable the optimal drain impedance to have an imaginary part and equal-electrical length with that of the carrier harmonic modulated impedance inverter 104C. This can be achieved by changing the electrical length of the peaking harmonic modulated impedance inverter 104P input feeding line ($L_{feed2}$). Then, $L_{C1}$ and $C_1$ in the peaking harmonic modulated impedance inverter 104P also need to be changed based on Equations (13) and (14) to realize a "pure reactance" at the third harmonic termination. When the peaking harmonic modulated impedance inverter 104P design is finished, a quarter wave-length microstrip line 106 is added to compensate for the phase difference between these two devices 104P, 104C. This enables phase compensation between the carrier and peaking device 102C, 102P, which enables optimum power combining of the Doherty-like power amplifier 100.

The design of the post matching network 108 is now presented. The post matching network 108 is required to achieve ideal "real-to-real" impedance transformation at the fundamental frequency. While at harmonics (2f, 3f) it needs to present a relatively high impedance to prevent harmonic power leakage, to allow harmonic interaction. This "relatively high impedance" is located on the right half side of the Smith chart. This gives a greater design freedom, while at the same time maintaining broadband harmonic interaction.

Figure 8:
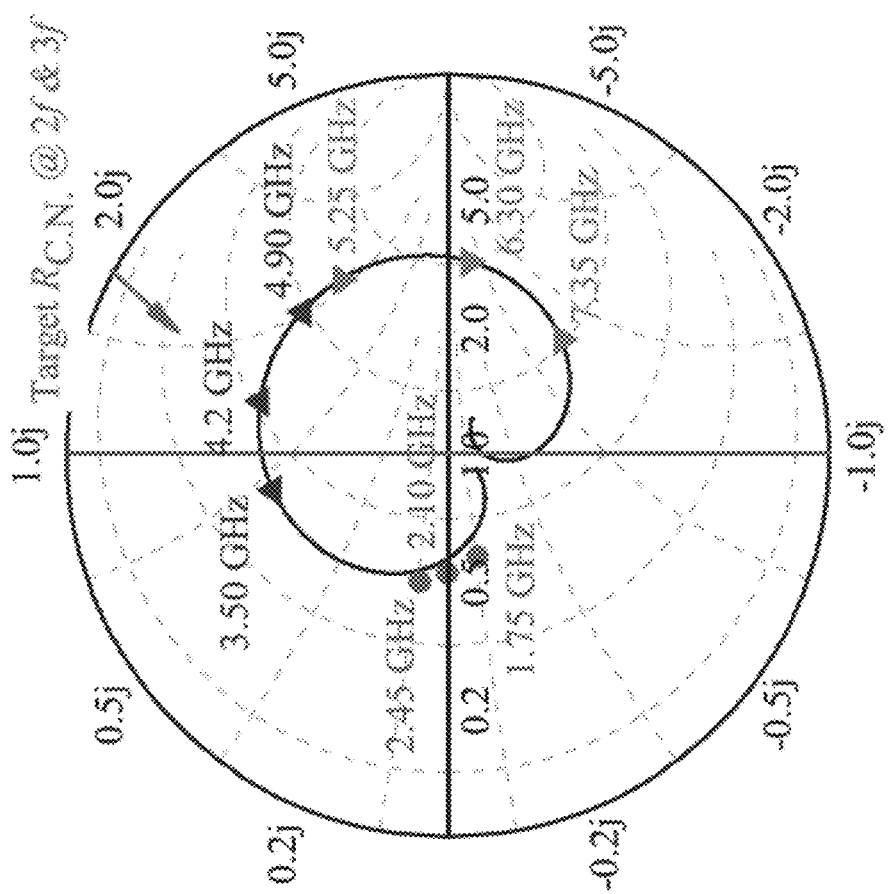
FIG. 8 is a Smith chart illustrating the simulated impedance of $R_{C,N}$ at the fundamental, second, and third harmonic frequencies.

To verify the theory, simulated impedance of $R_{C.N}$ at the fundamental, second, and third harmonic frequencies are shown in FIG. 8.

Figure 9:
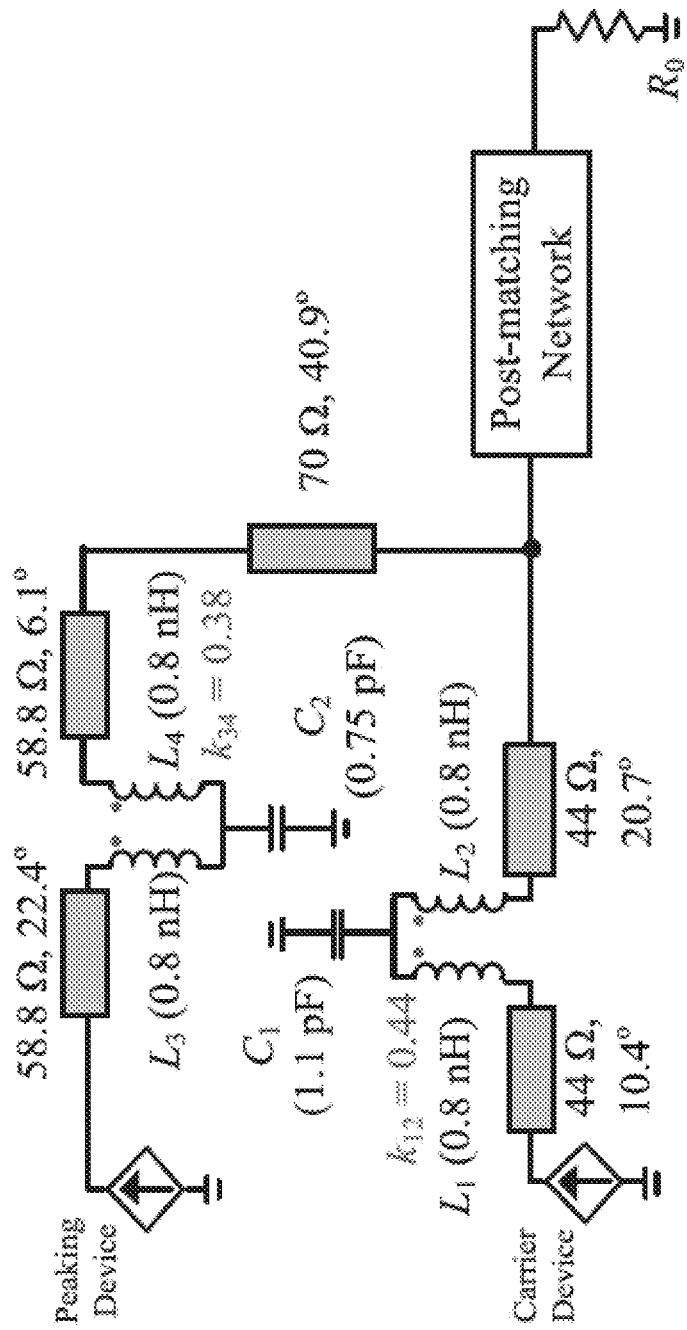
FIG. 9 is a circuit diagram of an equivalent circuit of a load modulation network in a Doherty-like power amplifier of FIG. 1.

FIG. 9 shows an equivalent circuit of the load modulation network of the Doherty-like power amplifier 100. The carrier and peaking impedance inverters can each be viewed as an equivalent T-network circuit ($L_1$=0.8 nH, $L_2$=0.8 nH, $k_{12}$=0.44, $C_1$=1.1 pF, $L_3$=0.8 nH, $L_4$=0.8 nH, $k_{34}$=0.38, $C_2$=0.8 pF). Furthermore, the phase compensation network is formed by a single transmission line (70 Ω, 40.9°). After the combining node (C.N.), the post-matching network realizes a real-to-real impedance transformation.

Figure 10:
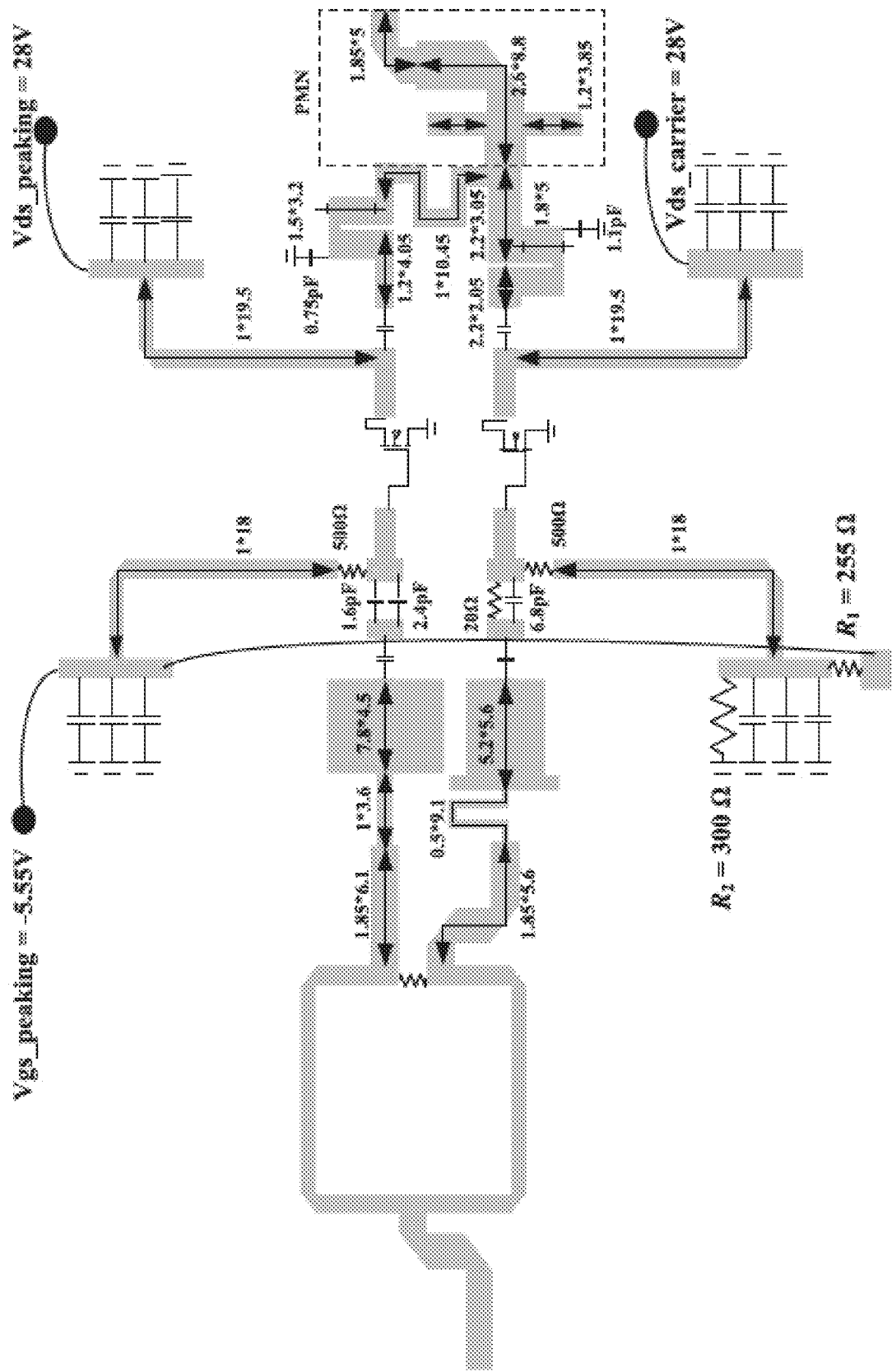
FIG. 10 is a schematic diagram of a Doherty-like power amplifier of FIG. 1 with its dimensions illustrated in one embodiment of the invention.

FIG. 10 illustrates the dimensions of the Doherty-like power amplifier 100 in one example. For the purpose of power supply reduction, a voltage divider network ($R_1$=255 ohm and $R_2$=300 ohm) is used to provide the desired gate bias voltage for the carrier and peaking device 102C, 102P.

Figure 11:
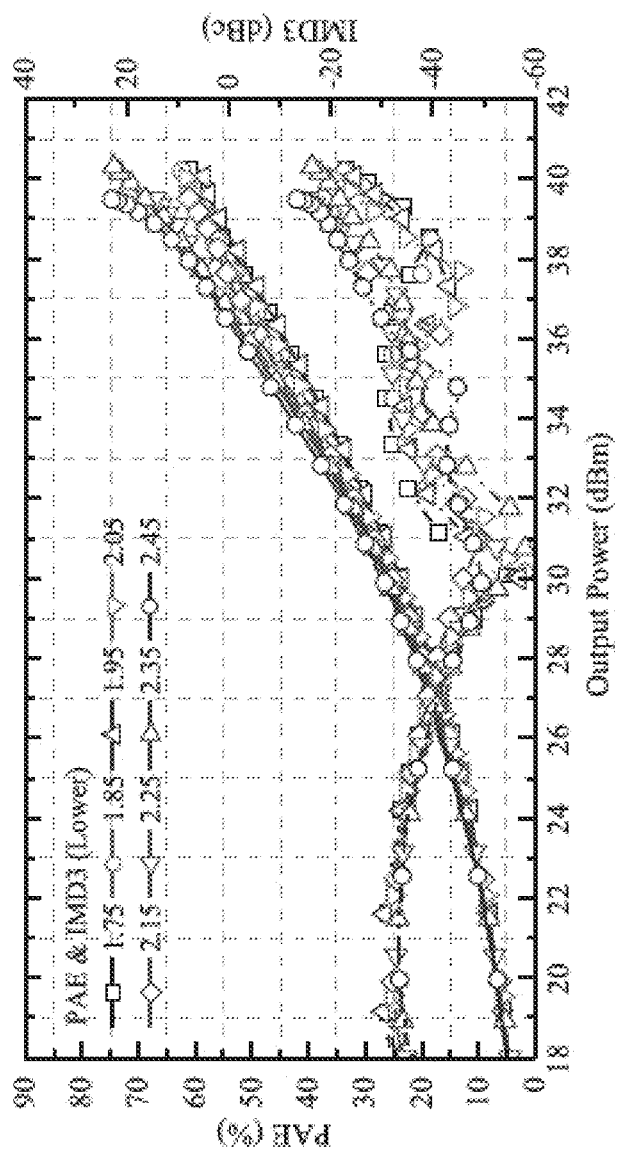
FIG. 11 is a graph showing the simulated variations of power-added efficiency and lower IMD3 against output powers over an operating frequency range under two-tone excitation (5-MHz) of the Doherty-like power amplifier.
Figure 12:
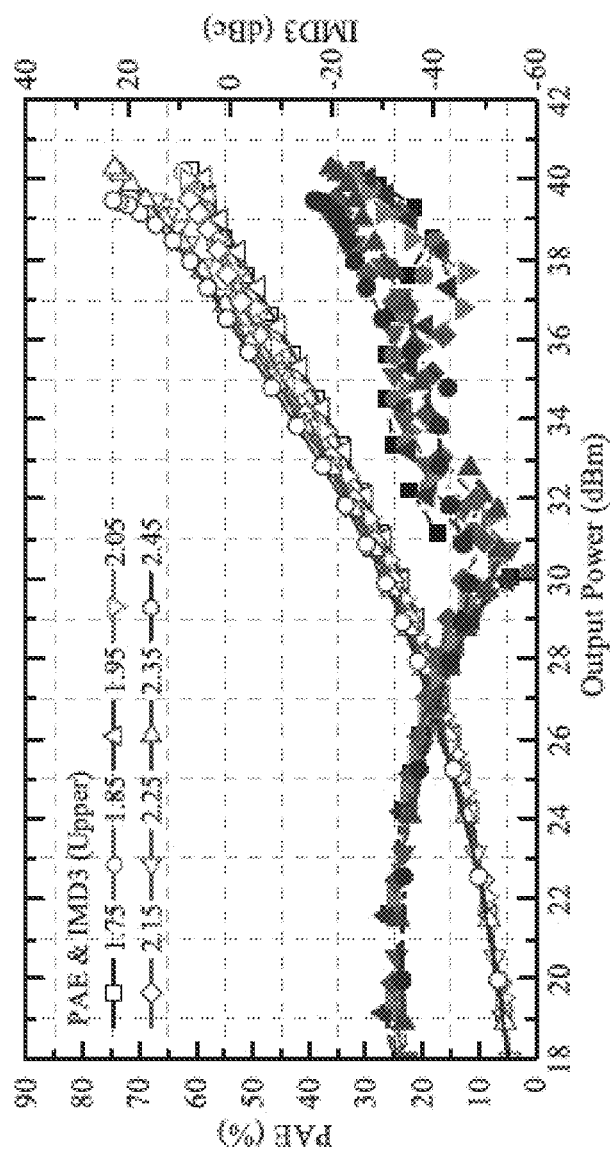
FIG. 12 is a graph showing the simulated variations of power-added efficiency and upper IMD3 against output powers over an operating frequency range under two-tone excitation (5-MHz) of the Doherty-like power amplifier.

FIGS. 11 and 12 show simulated power-added efficiency and IMD3 (lower/upper) across the output powers and over the entire operating frequency range under two-tone excitation (5-MHz). 5-MHz tone spacing is narrow enough to show improved IMD3 performance in the Doherty-like power amplifier 100 of this embodiment, caused by non-clipping currents in the active devices 102P, 102C. The carrier ($I_{DQ}$=50 mA) and peaking devices (biased at −5.45 V) uses identical 6-Watts GaN HEMTs (CGH40006P) from Cree Inc. Symmetrical drain bias were used and set to 28V. When the lower and upper IMD3 first reaches −30 dBc, the corresponding power added efficiency (PAE) are at least 53.5% and 53.8%, respectively. Since the performance of the Doherty-like power amplifier 100 focuses mainly on IMD3, the resulting efficiency behavior may deviate slightly from the classic Doherty characteristics, hence the power amplifier being referred to as Doherty-like power amplifier 100.

Figure 13:
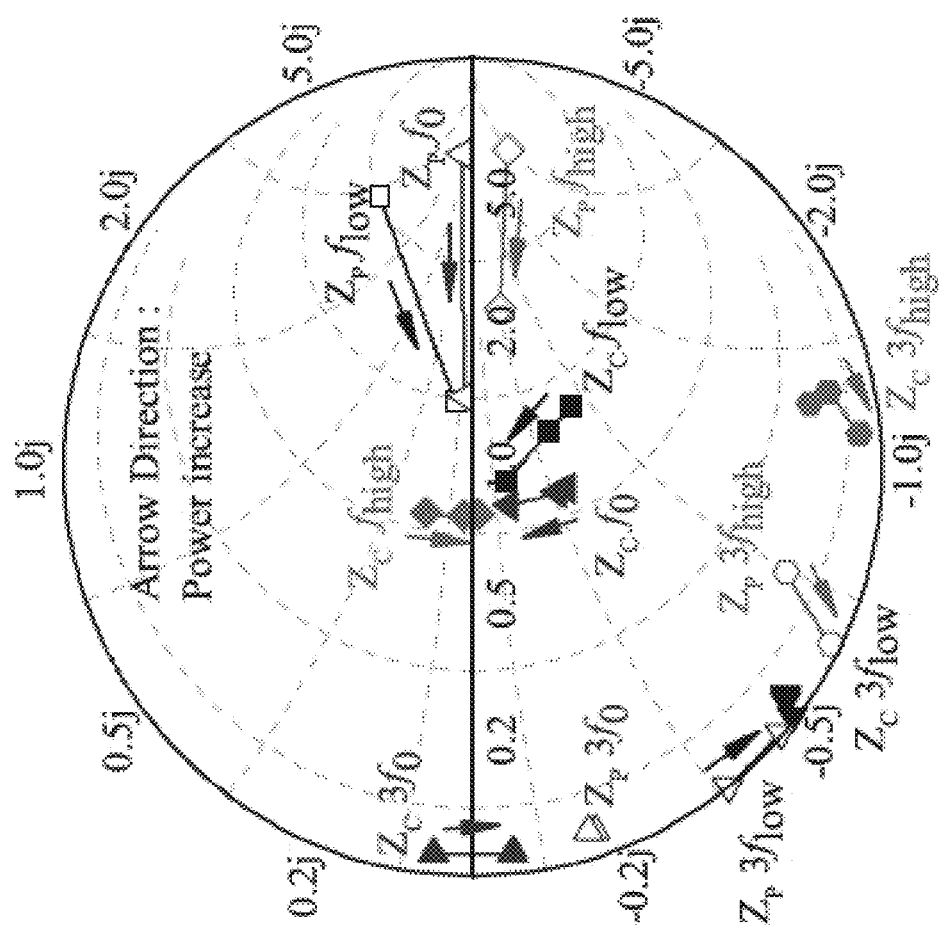
FIG. 13 is a Smith chart illustrating simulated current-plane drain terminations of carrier and peaking devices of the Doherty-like power amplifier at the fundamental and third harmonic frequencies from back-off to saturation.

To verify the theoretical analysis, the simulated intrinsic $Z_C$ and $Z_P$ from the low power regions to nearly saturation (2-dB back-off point), over the entire operating frequency range, are shown in FIG. 13 (for fundamental and third harmonics), 24, and 25 (for second harmonics).

For the carrier device 102C, at the fundamental frequencies (flow=1.75 GHz, $f_o$=2.1 GHz and $f_{high}$=2.45 GHz), the real part of $Z_C$ is practically unchanged, whereas, the imaginary part of $Z_C$ can be seen to move towards the real axis with increase in output power. At the third harmonic frequencies ($3f_{low}$=5.25 GHz, $3f_o$=6.3 GHz and $3f_{high}$=7.35 GHz), the real part of $Z_C$ are always close to zero. It can also be seen on the Smith chart that the imaginary part presents a "pure reactance" at back-off and saturation. At the second harmonic ($2f_{low}$=3.5 GHz, $2f_o$=4.2 GHz and $2f_{high}$=4.9 GHz), according to FIG. 24, the sign of $Z_C$ becomes negative with increase in output power, which satisfies the non-clipping requirement presented above. It should be noted that the impedance at $Z_C@f_{low}$ does not have the desired optimal impedance (grazing the outer edge of the smith chart). That is caused by the overlarge harmonic current amplitude in the peaking device. As the simulation results are only up to the 2 dB back-off point of the Doherty-like power amplifier, this implies that the peaking device 102P is not fully conducting. Consequently, the results shown in FIG. 13 for an incomplete load modulation of $Z_P$ at the fundamental frequency ($f_{low}$, $f_o$, $f_{high}$). Similarly, for the carrier device 102C, $Z_P$ at the third harmonic ($3f_{low}$, $3f_o$, $3f_{high}$) also provides a "pure reactance" at saturation.

For the second harmonic, the real part of $Z_P$ at second harmonic frequencies ($2f_{low}$, $2f_o$, $2f_{high}$) have positive values and their impedances are located along the edge of the Smith chart with a small reactance (see table III). Such kind of impedance is located in the non-clipping region, which is generated by the "pure reactance" of $Z_P@3f_o$.

Figure 14:
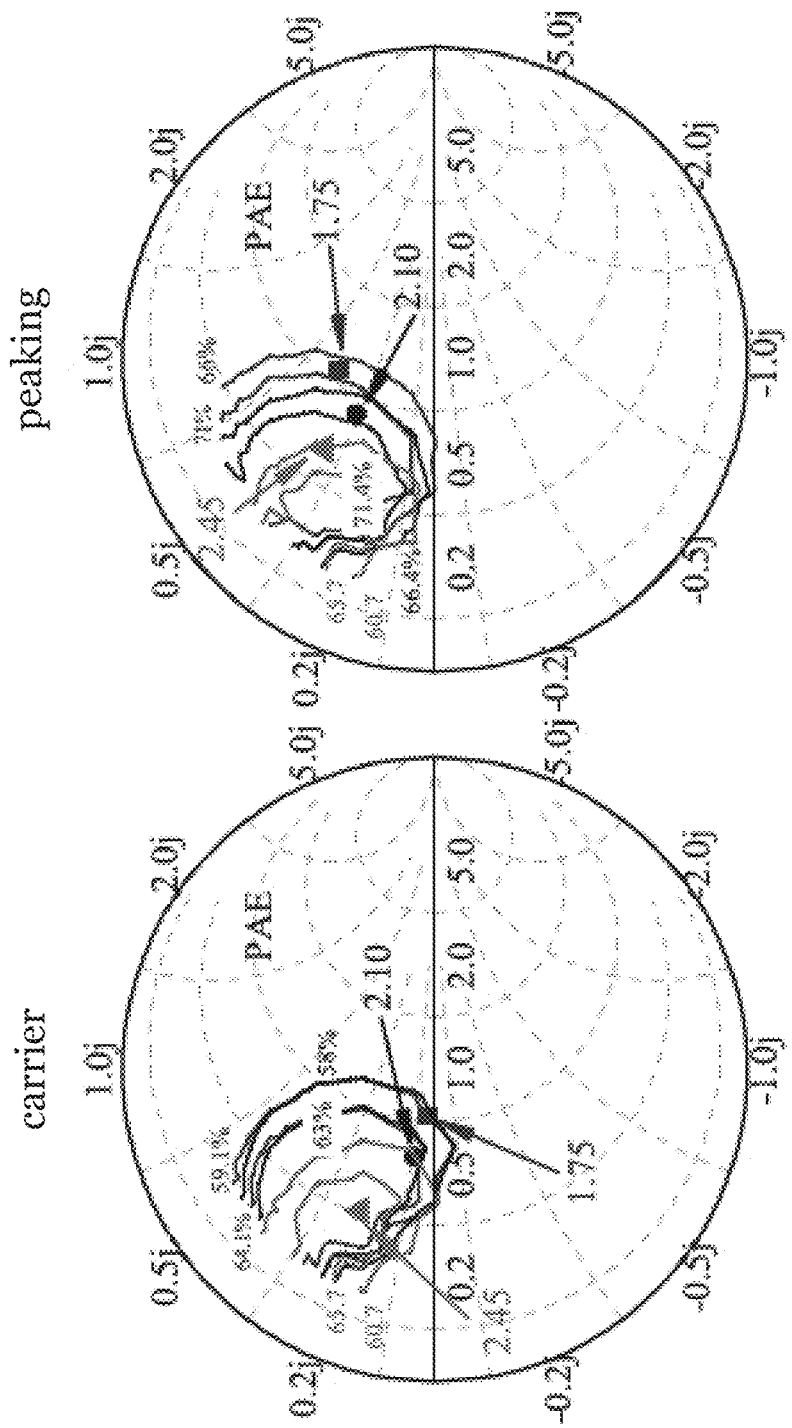
FIG. 14 is a Smith chart illustrating simulated package-plane drain terminations of the respectively carrier and peaking devices of the Doherty-like power amplifier at the fundamental frequency and their optimal load-pull results.
Figures 16A, 16B, 16C, 16D, 16E, 16F:
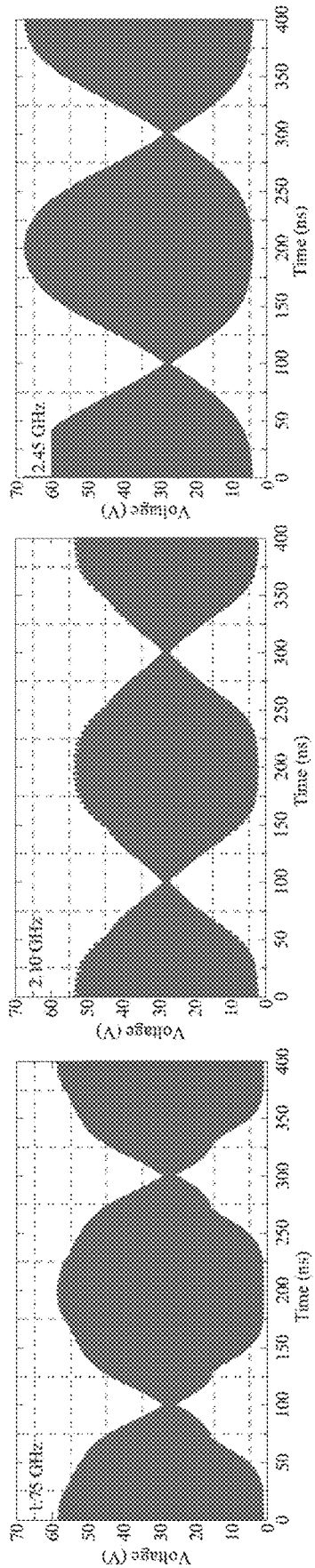
FIG. 16A is a graph illustrating peaking voltage waveform of 1.75 GHz when the IMD3 of the Doherty-like power amplifier first reaches −30 dBc within the operating frequency range.
FIG. 16B is a graph illustrating peaking voltage waveform of 2.10 GHz when the IMD3 of the Doherty-like power amplifier first reaches −30 dBc within the operating frequency range.
FIG. 16C is a graph illustrating peaking voltage waveform of 2.45 GHz when the IMD3 of the Doherty-like power amplifier first reaches −30 dBc within the operating frequency range.
FIG. 16D is a graph illustrating peaking current waveform of 1.75 GHz when the IMD3 of the Doherty-like power amplifier first reaches −30 dBc within the operating frequency range.
FIG. 16E is a graph illustrating peaking current waveform of 2.10 GHz when the IMD3 of the Doherty-like power amplifier first reaches −30 dBc within the operating frequency range.
FIG. 16F is a graph illustrating peaking current waveform of 2.45 GHz when the IMD3 of the Doherty-like power amplifier first reaches −30 dBc within the operating frequency range.

To verify that the carrier and peaking devices 102C, 102P are operating at the optimal impedance (obtained from the load-pull simulator), the Doherty-like power amplifier 100 is operated deep into saturation (input power is 33 dBm). FIG. 14 shows the simulated package-plane drain terminations of carrier and peaking devices 102C, 102P at the fundamental frequency and their load-pull results. It should be noted that the package-plane drain terminations at some frequencies are not perfect but they can still maintain good efficiency.

FIGS. 15A to 16D show de-embedding voltage/current (V/I) time domain waveforms of the carrier and peaking devices over the entire operating frequency at the 2-dB back-off point of the Doherty-like power amplifier 100. The voltages of the carrier and peaking devices 102C, 102P always graze "zero", which avoids current clipping of the devices 102C, 102P. This enables a sine wave for the current envelope in the carrier and peaking devices 102C, 102P. Consequently, a high linearity performance (IMD3<−30 dBc) can be obtained at the end of the Doherty region.

The voltage of the carrier device 102C at 2.1 GHz (shown in FIG. 15B) is not standard because of the voltage/current burr caused by high-order intermodulation products, which are difficult to avoid. It can be observed that an imperfect current amplitude and shape of the peaking device occurs at 1.75 GHz (shown in FIG. 16D). This is because the second harmonic current generated by the peaking device is very large, which results in flattening of the top. However, since the peaking device 102P is not fully conducting at this point, it does not contribute much to the non-linearity of the entire Doherty-like power amplifier 100. Hence, the IMD3 performances are not severely impaired.

Figure 17:
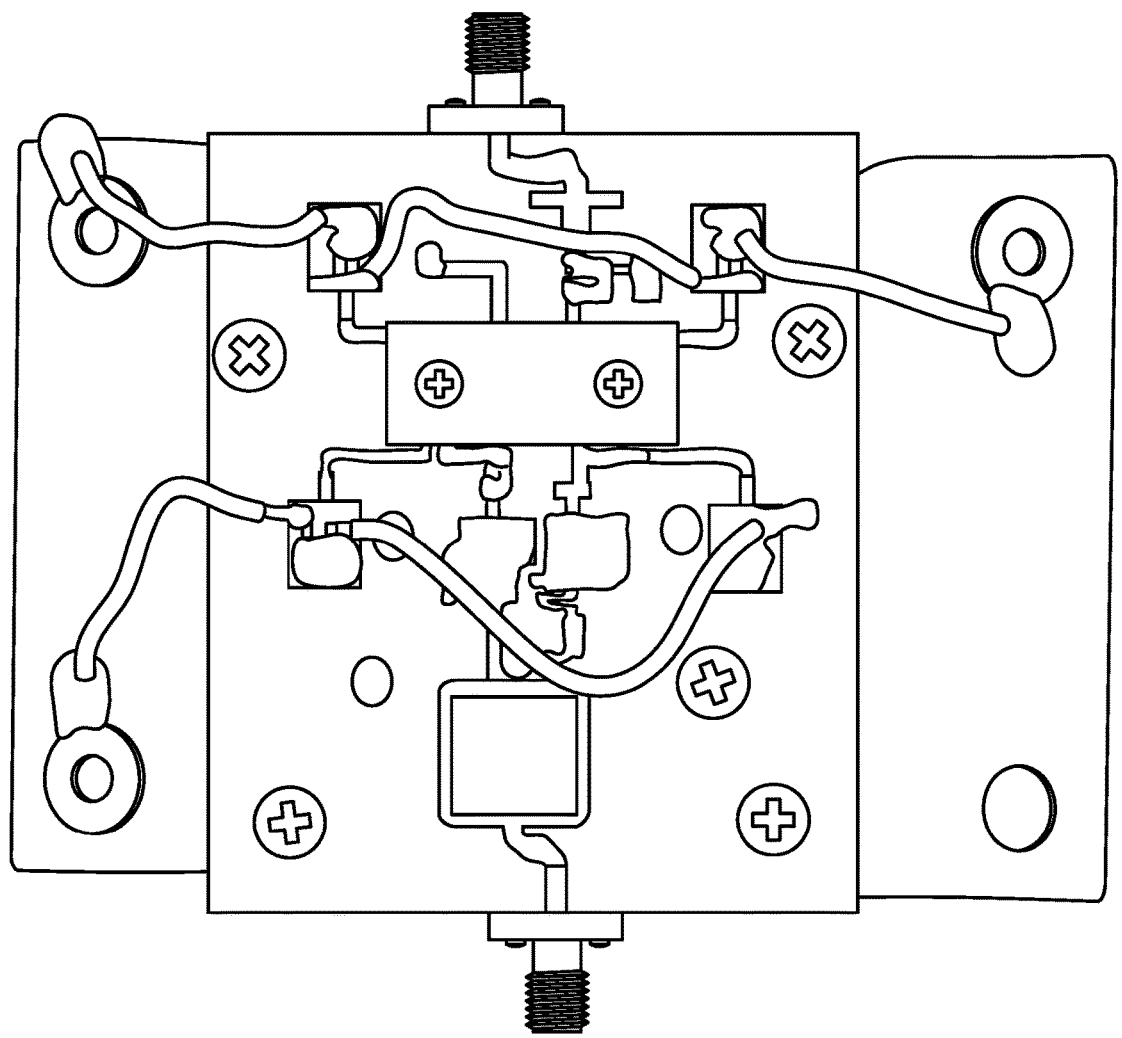
FIG. 17 is a photograph of a fabricated Doherty-like power amplifier in one embodiment of the invention.

A Doherty-like power amplifier using harmonic modulated impedance inverter as presented above was fabricated and tested to demonstrate the feasibility of the proposed design. The carrier ($I_{DQ}$=66 mA) and peaking devices (biased at −5.55 V) use identical 6-Watts GaN HEMTs (CGH 40006P) from Cree Inc. Symmetrical drain bias were set to 28V for both devices. FIG. 17 shows a photograph of the fabricated Doherty-like power amplifier.

Various measurements have been performed to test the fabricated Doherty-like power amplifier.

Figure 18A:
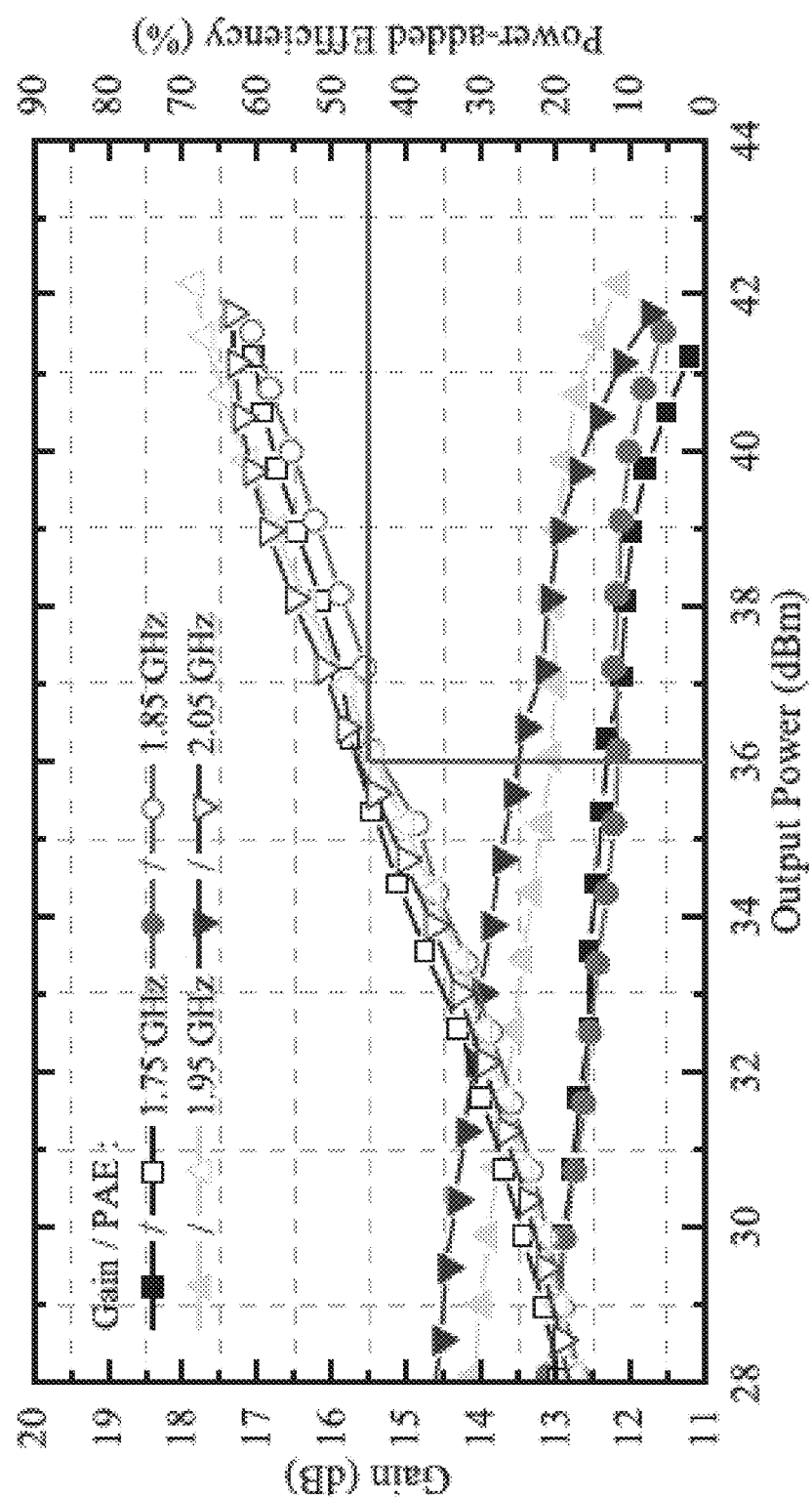
FIG. 18A is a graph illustrating the variations in measured power-added efficiency and gain against output power of the Doherty-like power amplifier of FIG. 17, in the frequency range of 1.75 GHz to 2.05 GHz.
Figure 18B:
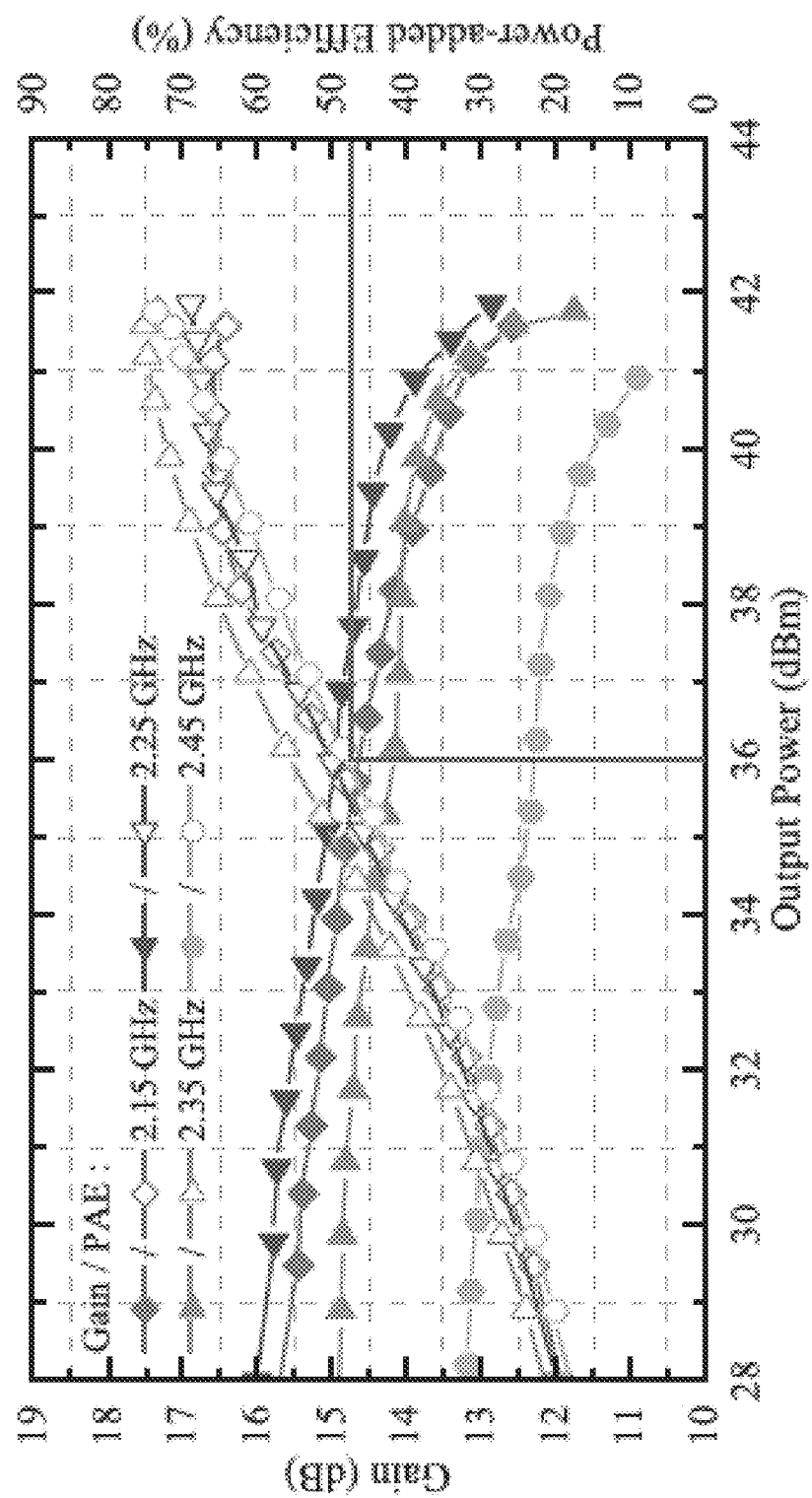
FIG. 18B is a graph illustrating the variations in measured power-added efficiency and gain against output power of the Doherty-like power amplifier of FIG. 17, in the frequency range of 2.15 GHz to 2.45 GHz.

FIG. 18 shows measured one-tone power added efficiency and gain versus output power over the entire operating frequency range. As seen from FIG. 18, from 1.75 GHz to 2.45 GHz, which corresponds to a bandwidth of 33.3%, the power added efficiency is better than 45.0% and 55% for 6 dB output back-off and saturation, respectively. The gain decreases from 17 dB to 13 dB across output power over the operating frequency band. The gain variation of the Doherty-like power amplifier is relatively large but the efficiency performance is still acceptable over the entire operating frequency bands.

Figure 19A:
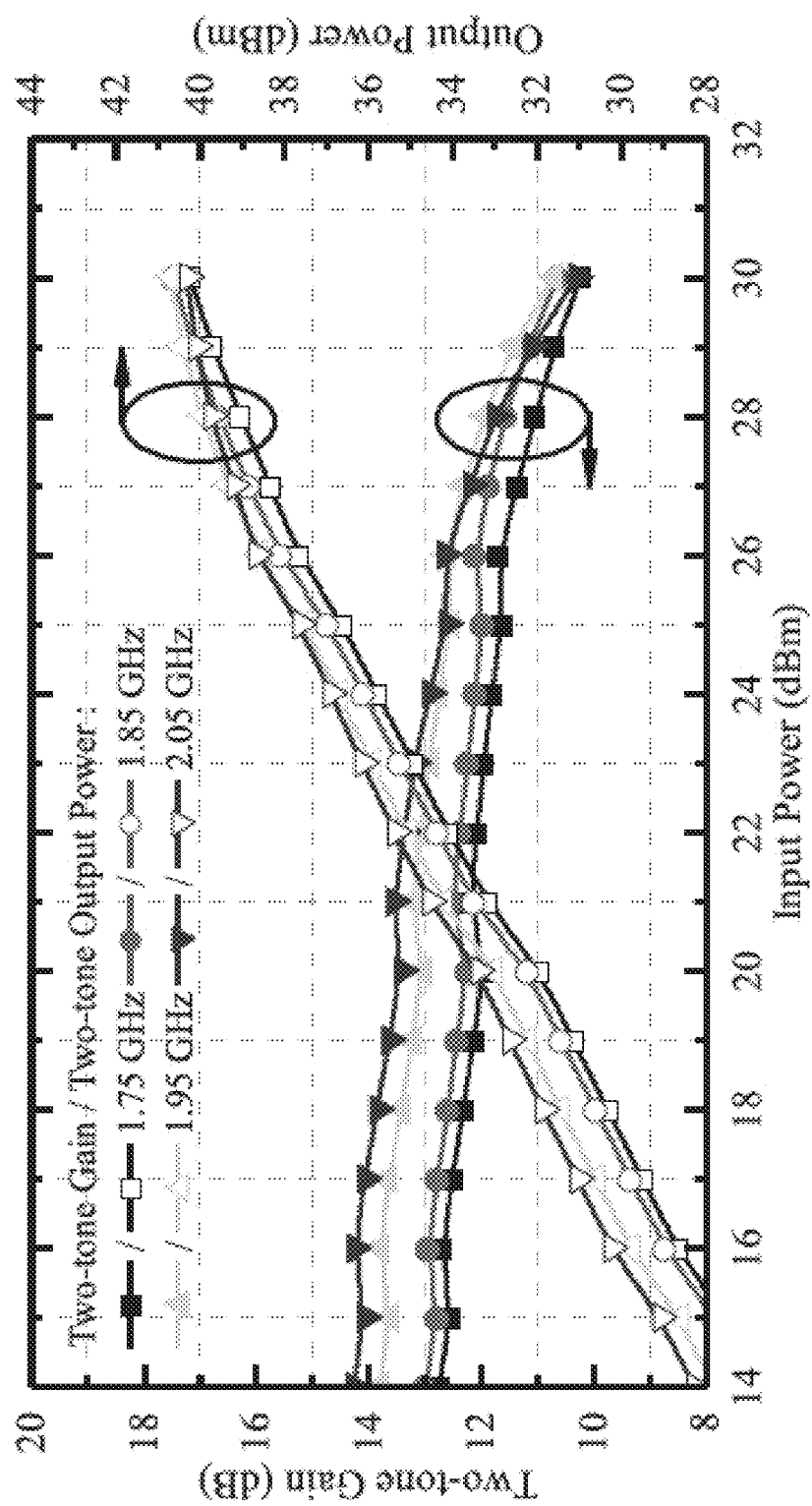
FIG. 19A is a graph illustrating the variations in measured output power and gain against input power of the Doherty-like power amplifier of FIG. 17, in the frequency range of 1.75 GHz to 2.05 GHz.
Figure 19B:
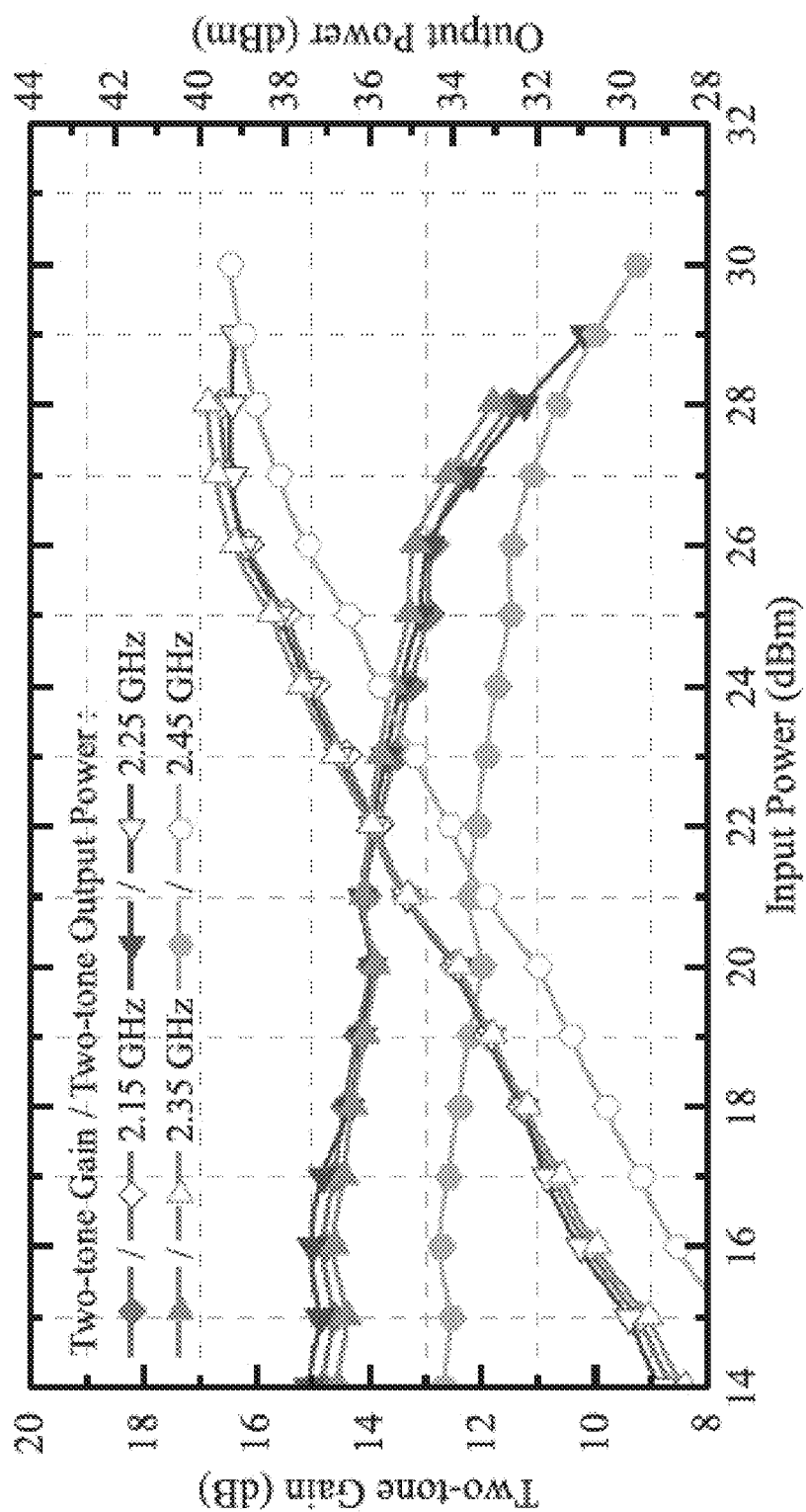
FIG. 19B is a graph illustrating the variations in measured output power and gain against input power of the Doherty-like power amplifier of FIG. 17, in the frequency range of 2.15 GHz to 2.45 GHz.

FIG. 19 shows measured output power and gain under two-tone excitation against input power over the entire operating frequency range. The two-tone output power of the Doherty-like power amplifier ranges from 39.3 to 40.7 dBm around saturation. From the two-tone gain test, good performance of gain flatness and gain compression can also be observed. In particular, the gain flatness is less than 0.5 dB while the gain compression is less than 3.5 dB over the entire operating frequency range.

Figure 20:
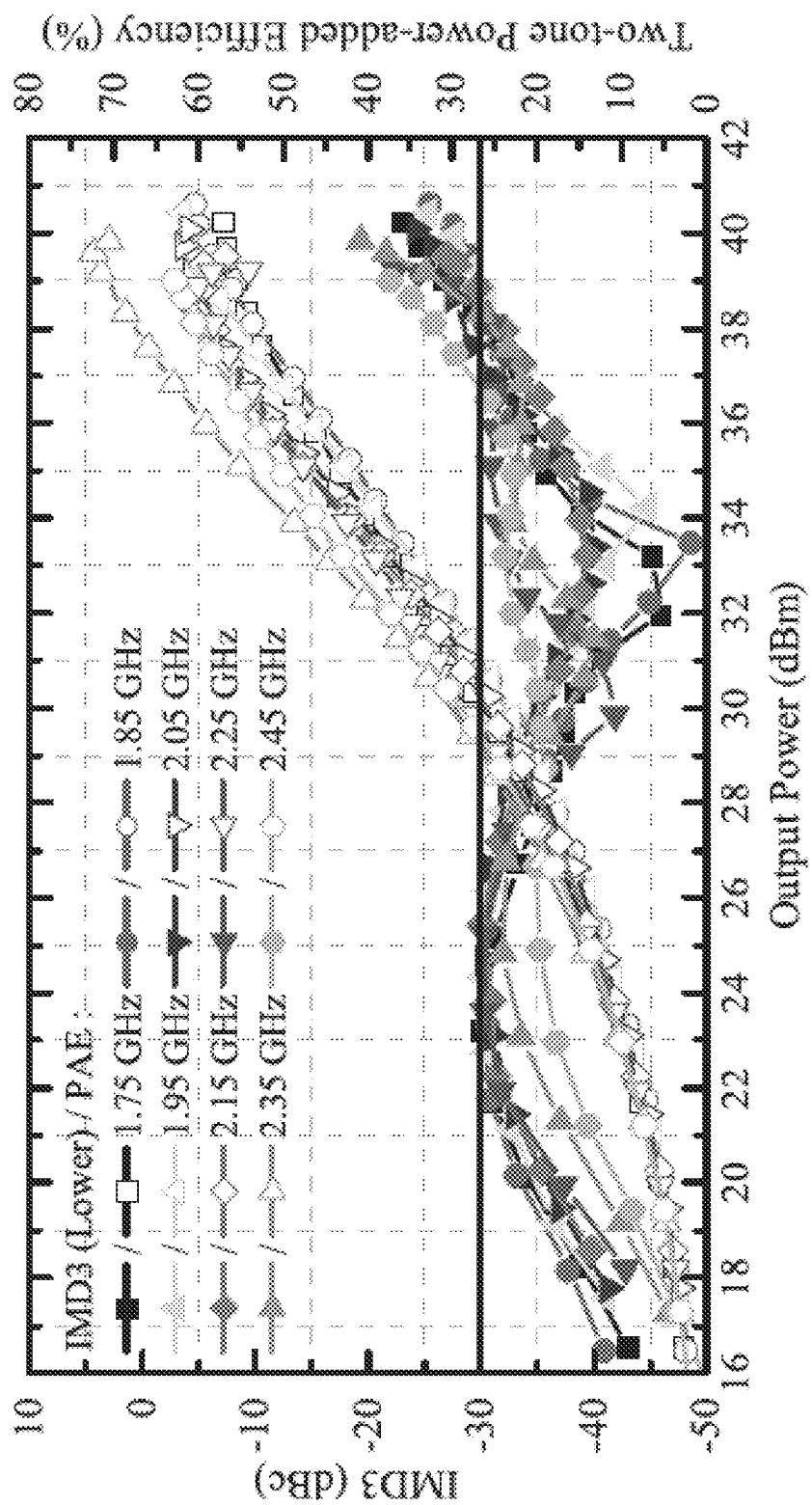
FIG. 20 is a graph illustrating the variations in measured two-tone (5-MHz tone spacing) power-added efficiency and lower IMD3 against output power of the Doherty-like power amplifier of FIG. 17.
Figure 21:
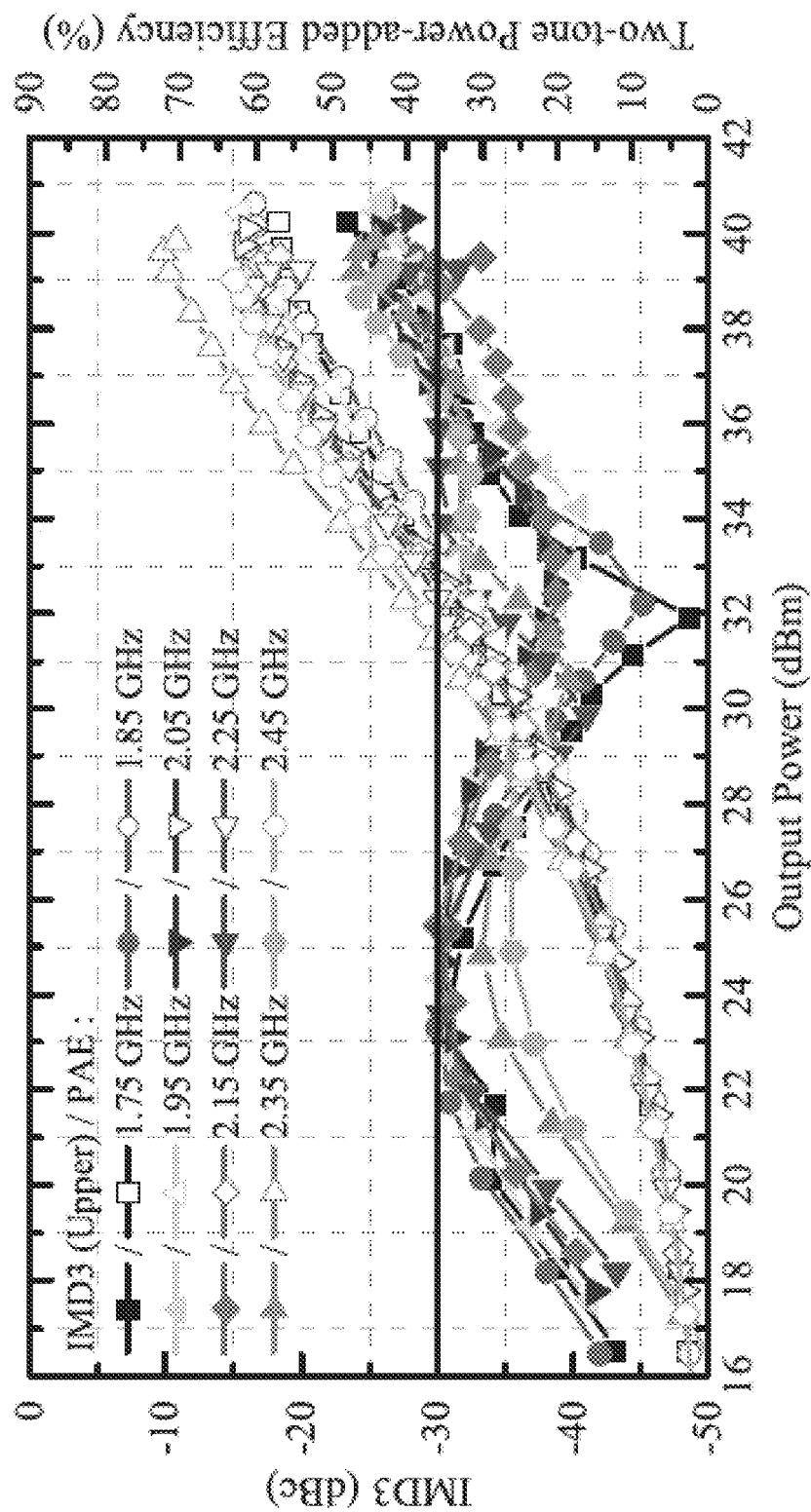
FIG. 21 is a graph illustrating the variations in measured two-tone (5-MHz tone spacing) power-added efficiency and upper IMD3 against output power of the Doherty-like power amplifier of FIG. 17.

To test the linearity of the Doherty-like power amplifier, measurements were performed using a two-tone signal with a 5-MHz tone spacing. IMD3 were measured using the Agilent CXA Signal Analyzer N9000A. FIGS. 20 and 21 illustrate the two-tone (5 MHz tone spacing) power added efficiency and IMD3.

As seen from FIGS. 20 and 21, in the operating frequency band, the lower IMD3 at an output power of 36 dBm and saturation are better than −32 dBc and −20 dBc, respectively. The upper IMD3 at 6 dB output back-off point (36 dBm) and saturation are better than −30 dBc and −25 dBc, respectively. Measured IMD3 results shows good agreement with simulation. It should be noted that the lower and upper IMD3 of the Doherty-like power amplifier almost reaches −30 dBcl at a low power of approximately 24 dBm. The table in FIG. 26 gives a clearer view of IMD3 at this output power, and verifies that IMD3 does not exceed −30 dBc.

It can be seen that the Doherty-like power amplifier achieves excellent trade-off between efficiency and linearity. As shown in the table in FIG. 27, when IMD3 first reaches −30 dBc, for the lower IMD3, power added efficiency ranges from 53.5% to 68.5%. For the upper IMD3, its power added efficiency ranges from 53% to 65.9%.

Figure 22:
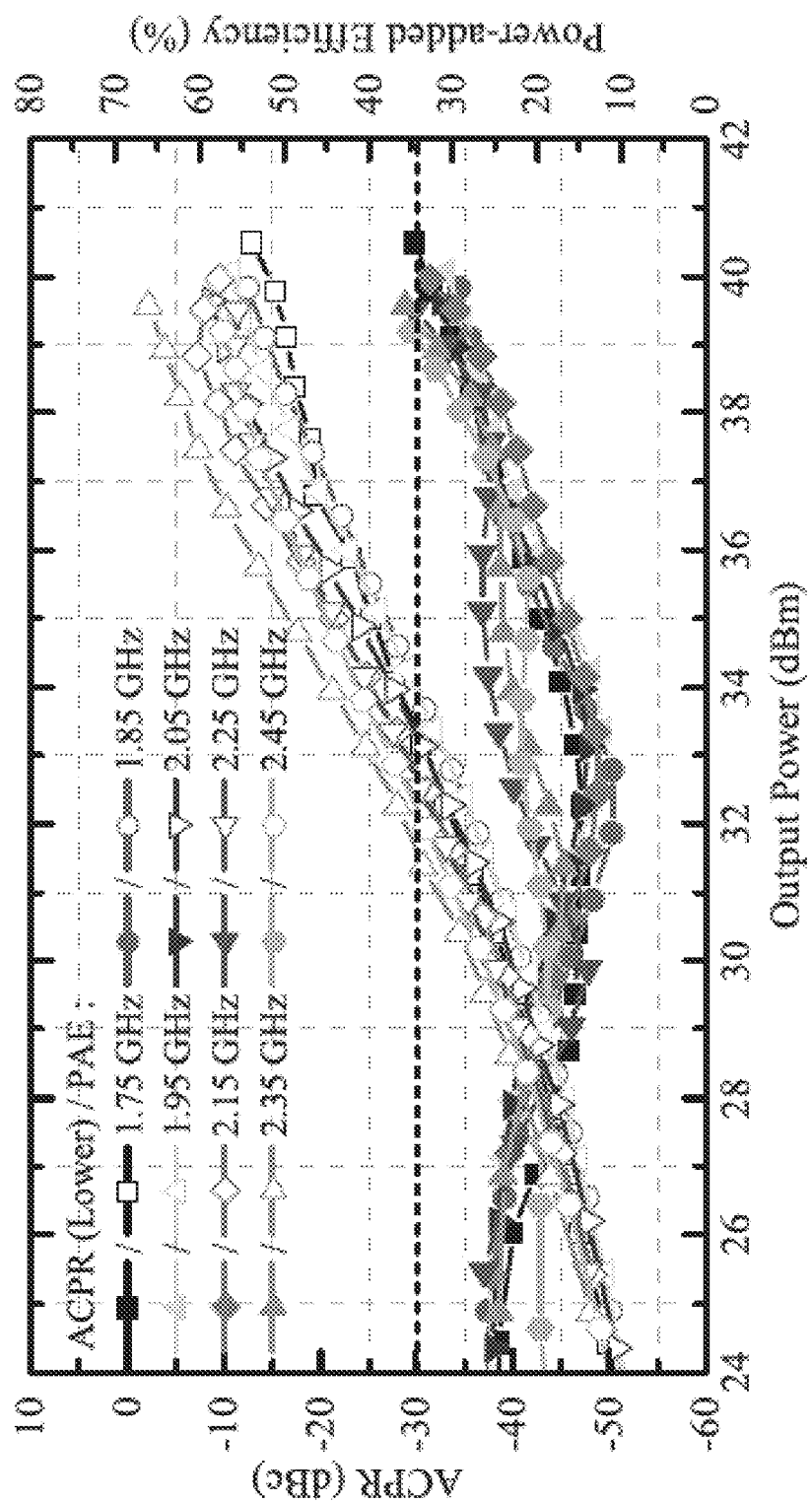
FIG. 22 is a graph illustrating the variations in measured power-added efficiency and lower ACPR against output power of the Doherty-like power amplifier of FIG. 17 under WCDMA signal excitation.
Figure 23:
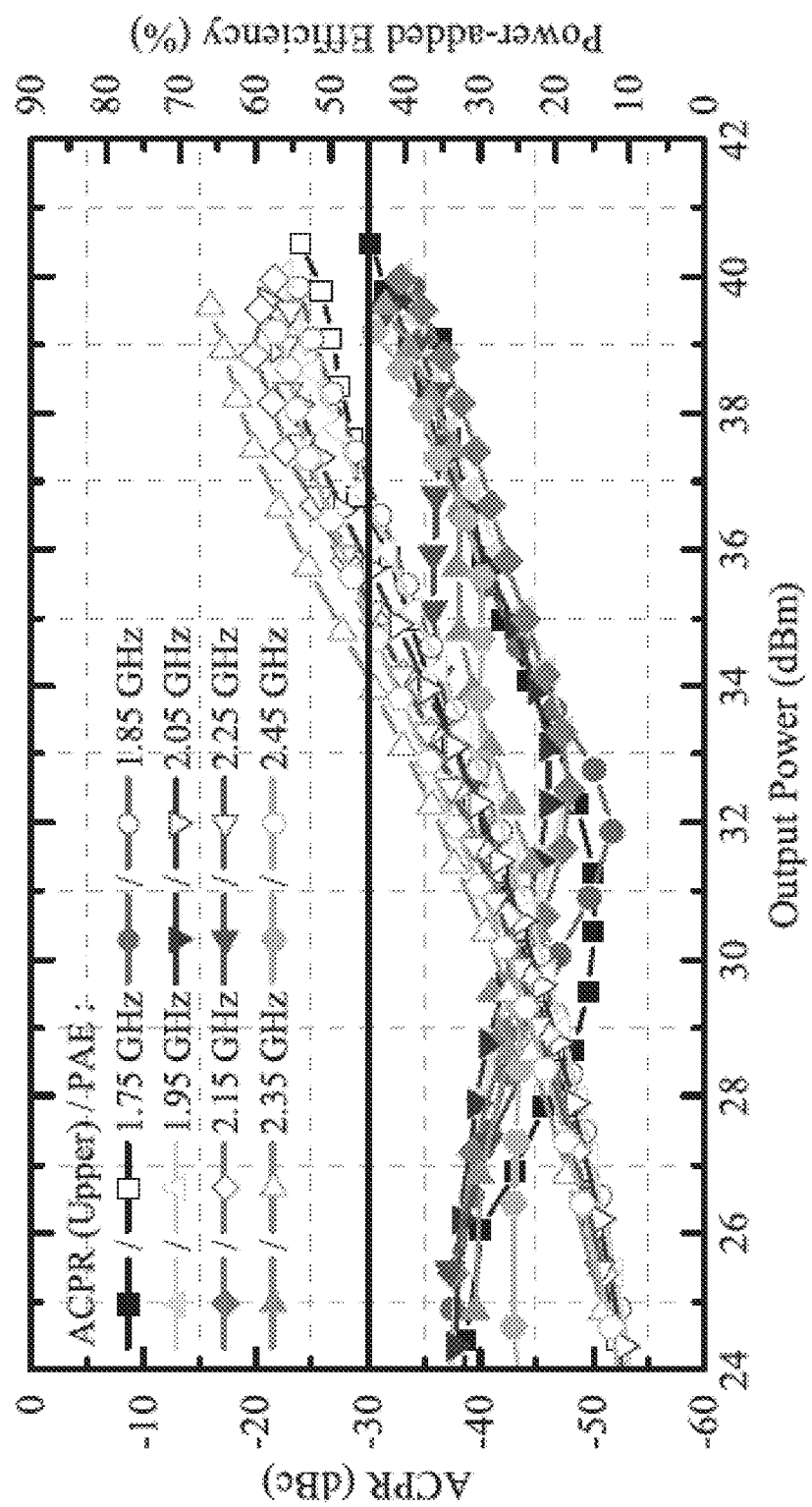
FIG. 23 is a graph illustrating the variations in measured power-added efficiency and upper ACPR against output power of the Doherty-like power amplifier of FIG. 17 under WCDMA signal excitation.

To test the linearity of the Doherty-like power amplifiers, measurements were performed using a WCDMA 3GPP 5-MHz test signal with a PAPR of 6.5 dB, which corresponds to the output back-off range of the Doherty-like power amplifier. Adjacent channel power ratio (ACPR) was measured using the Agilent CXA Signal Analyzer N9000A. FIGS. 22 and 23 show the power added efficiency and adjacent channel power ratio for both upper and lower bands. As shown in FIGS. 22 and 23, in the operating frequency range, the power added efficiency at an output power of 36 dBm are better than 42%. When the lower and upper adjacent channel power ratio first reaches −30 dBc, the corresponding output power is roughly 40 dBm, which has at least 55% of power added efficiency.

In the above embodiments of the invention, the harmonic modulated impedance inverters have been implemented into the Doherty-like power amplifier topology. In some embodiments, the power amplifier provides mutual interaction at harmonics, does not require an additional harmonic injection network, and provides modulated harmonic terminations at both $2f_o$ and $3f_o$. In some embodiment, not only does load modulation occur at the fundamental frequency, second harmonic interaction at the drain terminations with specific third harmonic terminations has also been achieved simultaneously. Consequently, a non-clipping current is made possible in the carrier and peaking device near saturation, which results in an improved IMD3 performance towards the end of the Doherty region. This enables the Doherty-like power amplifier to achieve an optimal trade-off between efficiency and linearity. The power amplifier design of the invention enables a new level of improved performance (in terms of efficiency, linearity, gain, bandwidth and/or PUF), which paves the way to enhanced data throughput in emerging wireless communication standards.

In some embodiments, the power amplifier may include one or more of these advantages: (i) wideband operating bandwidth (33%), which can cover the frequency band of cellular communication network, e.g., 4G, 5G or higher; (2) has at least 45% power-added efficiency at 6-dB back-off point; (3) has at least 53% efficiency when the IMD3 firstly reaches to −30 dBc; (4) manipulates the second and third harmonic terminations at the same time, which extends the design freedom of Doherty or Doherty-like power amplifier; (5) the harmonic interaction technique to perform harmonic load modulation, no (additional) harmonic injection network is required and this prevents bandwidth loss. The skilled person would appreciate that the listed advantages are non-exhaustive, and will depend on the specific implementation of the present invention.

Herein, the expressions "load modulation network" and "load modulation circuit" are used interchangeably herein; the expressions "phase compensation network" and "phase compensation circuit" are used interchangeably herein; the expressions "post-matching network" and "post-matching circuit" are used interchangeably herein.

The described embodiments of the invention should be considered in all respects as illustrative, not restrictive. It will be appreciated by persons skilled in the art that numerous variations and/or modifications may be made to the invention as shown in the specific embodiments to provide other embodiments of the invention.

For example, the power amplifier can include one or more power amplification devices in addition to the carrier and peaking devices. The carrier and peaking devices can be any power amplification devices. The carrier device may operate as a Class AB amplifier; the peaking device may operate as a Class C amplifier. The power amplification devices, such as the carrier and peaking devices, can be implemented using various types of transistors, including but not limited to FET, HEMT, etc., e.g., made using various materials such as GaN. The load modulation network, in particular the harmonic modulated impedance inverter and the phase compensation network, can be implemented differently than those illustrated in the above embodiments, using various circuit means, including but not limited to transmission lines or microstrip lines different shape, size, form, and/or geometry, so long as it can transform the impedance at the fundamental frequency and achieve termination interaction at harmonic frequencies (including $2^{nd}$ and $3^{rd}$ harmonics). The phase compensation network may include or be replaced with other types of transmission line(s). The post-matching network can be implemented using various circuit means, including but not limited to transmission lines or microstrip lines different shape, size, form, and/or geometry. The post-matching network can be high-order or lower-order, preferably low pass. The power amplifier can be used in different types of electrical devices and systems such as communication devices and systems. The electrical devices and/or systems may include base stations (e.g., for cellular communication, such as 4G, 5G, or higher), laptop computer, desktop computer, tablet computer, smart phone, smart watch, IoT device, etc.

The invention claimed is:
1. A power amplifier, comprising:
a main power amplification device having an output;
an auxiliary power amplification device having an output;
a load modulation circuit operably connected to the output of the main power amplification device and the output of the auxiliary power amplification device, the load modulation circuit comprising
a first harmonic-modulated impedance inverter operably connected with the output of the main power amplification device;

a second harmonic-modulated impedance inverter operably connected with the output of the auxiliary power amplification device; and
a phase compensation circuit operably connected between the first and second harmonic-modulated impedance inverters; and
a post-matching circuit operably connected to load modulation circuit;
wherein the load modulation circuit is arranged to enable fundamental frequency load modulation and to enable modulated harmonic terminations of at least second and third harmonic frequencies; and
wherein each of the first and second harmonic-modulated impedance inverters include:
a first transmission line;
a second transmission line;
a coupled line arranged to provide an electric coupling and operably connected between the first and second transmission lines; and
a grounded capacitor arrangement operably connected with the coupled line.

2. The power amplifier of claim 1, wherein the first harmonic-modulated impedance inverter is directly connected with the output of the main power amplification device.

3. The power amplifier of claim 1, wherein the second harmonic-modulated impedance inverter is directly connected with the output of the auxiliary power amplification device.

4. The power amplifier of claim 1, wherein the phase compensation circuit is directly connected between the first and second harmonic-modulated impedance inverters.

5. The power amplifier of claim 1, wherein a combining node is defined between the phase compensation circuit and the first harmonic-modulated impedance inverter, and the post-matching circuit is connected at the combining node.

6. The power amplifier of claim 1, wherein the coupled line is an end-coupled transmission line.

7. The power amplifier of claim 1, wherein the first and second transmission lines are parallel or collinear.

8. The power amplifier of claim 1, wherein the coupled line includes first and second coupled portions that provides the electric coupling, and the first and second coupled portions extending substantially perpendicularly to the first and second transmission lines.

9. The power amplifier of claim 1, wherein the first and second transmission lines and the coupled line are connected continuously.

10. The power amplifier of claim 1, wherein the first and second harmonic-modulated impedance inverters include the same electrical length.

11. The power amplifier of claim 1, wherein the phase compensation circuit comprises a transmission line.

12. The power amplifier of claim 11, wherein the transmission line comprises a quarter wavelength microstrip line.

13. The power amplifier of claim 1, wherein the post-matching circuit is operable to provide an impedance arranged to reduce or substantially prevent harmonic current leakage.

14. The power amplifier of claim 1, wherein the main power amplification device comprises a first active device; and the auxiliary power amplification device comprises a second active device in phase quadrature with the first active device.

15. The power amplifier of claim 14, wherein the first and second active devices each comprises a transistor.

16. The power amplifier of claim 14, wherein the main power amplification device is a carrier device, and the auxiliary power amplification device is a peaking device.

17. The power amplifier of claim 14, wherein the main power amplification device is arranged to operate as a Class AB amplifier, and the auxiliary power amplification device is arranged to operate as a Class C amplifier.

18. An electrical device or system comprising one or more of the power amplifier of claim 1.

19. A power amplifier, comprising:
a main power amplification device having an output;
an auxiliary power amplification device having an output;
a load modulation circuit operably connected to the output of the main power amplification device and the output of the auxiliary power amplification device; and
a post-matching circuit operably connected to load modulation circuit;
wherein the load modulation circuit is arranged to enable fundamental frequency load modulation and to enable modulated harmonic terminations of at least second and third harmonic frequencies; and
wherein the load modulation circuit comprises:
a first harmonic-modulated impedance inverter operably connected with the output of the main power amplification device;
a second harmonic-modulated impedance inverter operably connected with the output of the auxiliary power amplification device; and
a phase compensation circuit operably and directly connected between the first and second harmonic-modulated impedance inverters.

20. The power amplifier of claim 19, wherein each of the first and second harmonic-modulated impedance inverters include:
a first transmission line;
a second transmission line;
a end-coupled transmission line arranged to provide an electric coupling and operably connected between the first and second transmission lines; and
a grounded capacitor arrangement operably connected with the end-coupled transmission line.

21. The power amplifier of claim 19, wherein each of the first and second harmonic-modulated impedance inverters include:
a first transmission line;
a second transmission line arranged in parallel or collinear with the first transmission line;
a end-coupled transmission line arranged to provide an electric coupling and operably connected between the first and second transmission lines; and
a grounded capacitor arrangement operably connected with the end-coupled transmission line.

22. The power amplifier of claim 19, wherein each of the first and second harmonic-modulated impedance inverters include:
a first transmission line;
a second transmission line;
a end-coupled transmission line arranged to provide an electric coupling and operably connected between the first and second transmission lines; and
a grounded capacitor arrangement operably connected with the end-coupled transmission line;
wherein the coupled line includes first and second coupled portions that provides the electric coupling, and the first and second coupled portions extending substantially perpendicularly to the first and second transmission lines.

23. The power amplifier of claim 19, wherein each of the first and second harmonic-modulated impedance inverters include:
- a first transmission line;
- a second transmission line;
- a end-coupled transmission line arranged to provide an electric coupling and operably connected between the first and second transmission lines; and
- a grounded capacitor arrangement operably connected with the end-coupled transmission line;
- wherein the first and second transmission lines and the coupled line are connected continuously.

24. An electrical device or system comprising one or more of the power amplifier of claim 19.

* * * * *